United States Patent
Chung

(10) Patent No.: US 6,867,116 B1
(45) Date of Patent: Mar. 15, 2005

(54) FABRICATION METHOD OF SUB-RESOLUTION PITCH FOR INTEGRATED CIRCUITS

(75) Inventor: Henry Chung, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/703,453
(22) Filed: Nov. 10, 2003
(51) Int. Cl.[7] .......................... H01L 21/22; H01L 21/38
(52) U.S. Cl. ...................... 438/551; 438/761; 438/734; 438/735; 438/736; 438/737; 438/738
(58) Field of Search .................... 438/551, 758–761, 438/734, 735, 736, 737, 738, 584, 585, 778

(56) References Cited

U.S. PATENT DOCUMENTS

| | | | | |
|---|---|---|---|---|
| 5,811,345 A | * | 9/1998 | Yu et al. ...................... | 438/424 |
| 5,911,110 A | * | 6/1999 | Yu ............................... | 438/424 |
| 6,110,837 A | * | 8/2000 | Linliu et al. ................. | 438/723 |
| 6,537,866 B1 | * | 3/2003 | Shields et al. .............. | 438/183 |
| 6,576,536 B1 | * | 6/2003 | Babcock ...................... | 438/585 |
| 2004/0087092 A1 | * | 5/2004 | Huang et al. ............... | 438/296 |
| 2004/0087123 A1 | * | 5/2004 | Ahn et al. ................... | 438/585 |

* cited by examiner

Primary Examiner—Amir Zarabian
Assistant Examiner—Thanh Y. Tran
(74) Attorney, Agent, or Firm—Shaw Pittman LLP

(57) ABSTRACT

A method of manufacturing a semiconductor device using a scanner, wherein the scanner is capable of realizing a minimum pitch, wherein the minimum pitch is the smallest possible pitch for the scanner, the method including providing a semiconductor substrate, forming a first layer over the semiconductor substrate, forming a second layer over the first layer, patterning the second layer to form a plurality of second layer patterns, patterning the first layer to form a plurality of first layer patterns, performing a tone reversal to form a reversed tone for the second layer patterns, and etching the first layer patterns using the reversed tone as a mask, wherein the etched first layer patterns have a final pitch size, and wherein the final pitch is smaller than the minimum pitch.

20 Claims, 24 Drawing Sheets

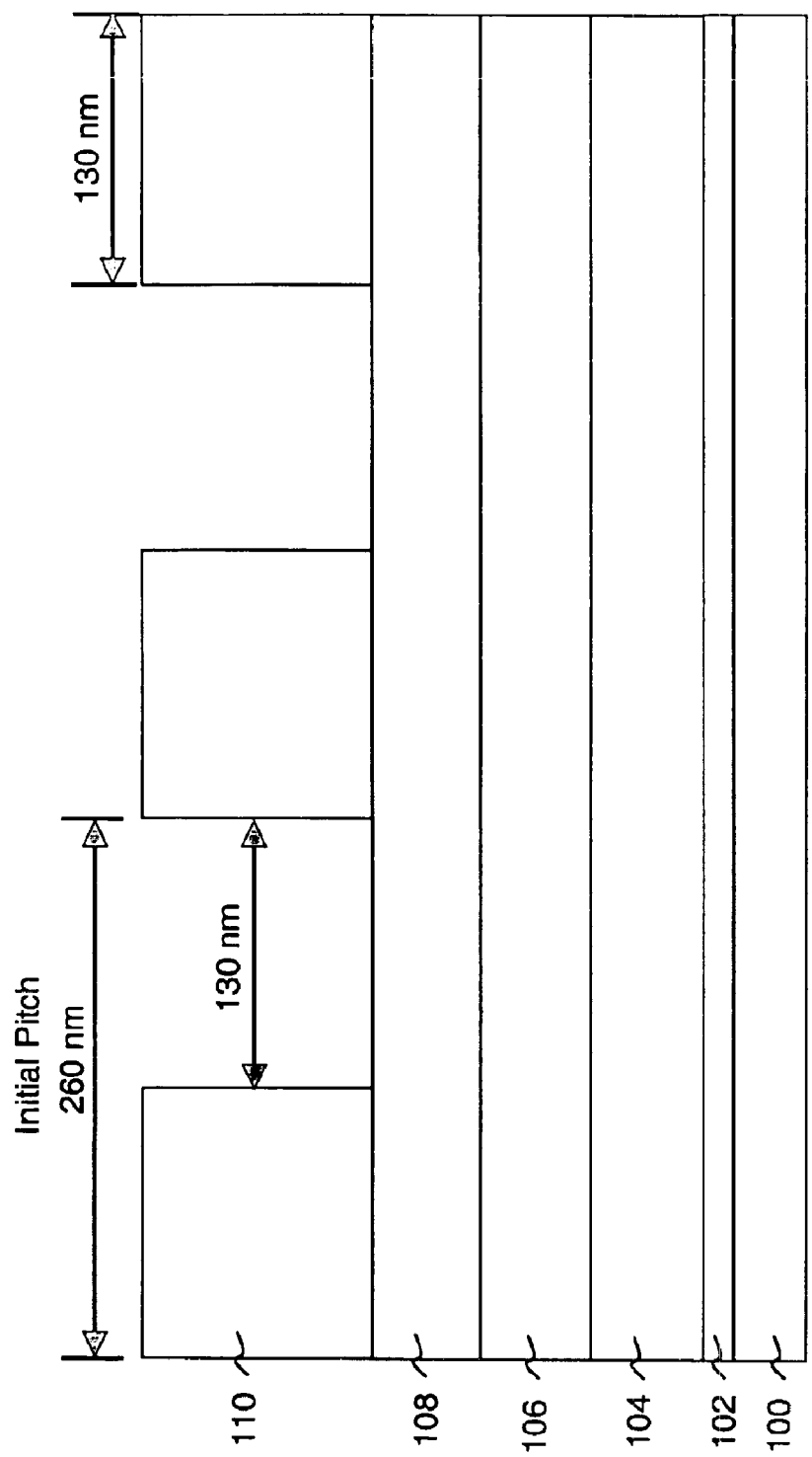

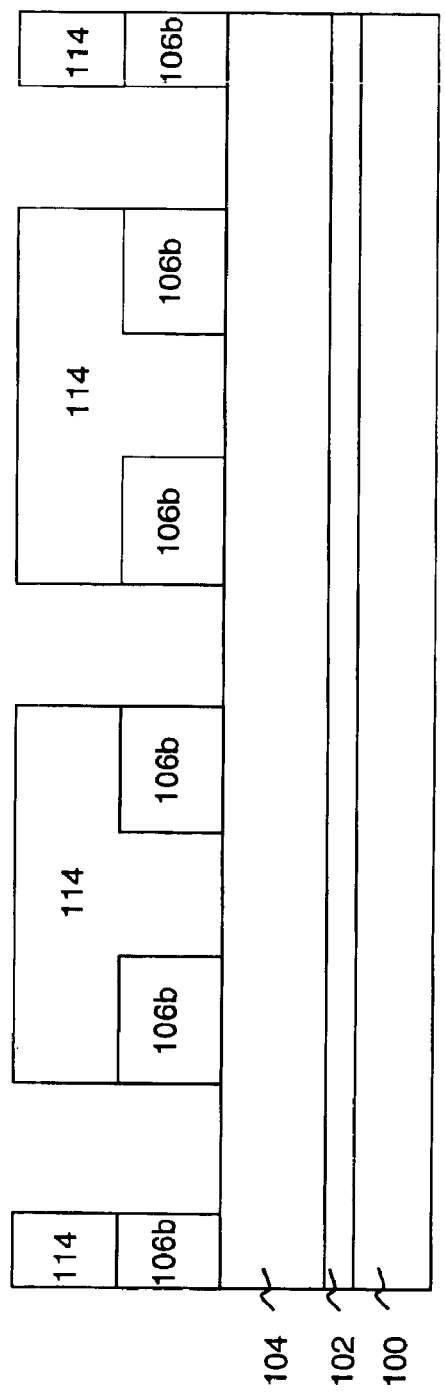
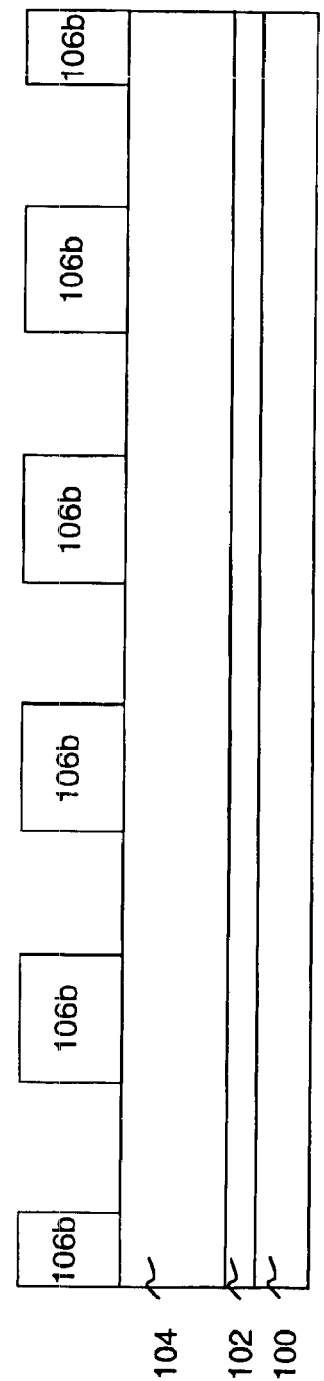

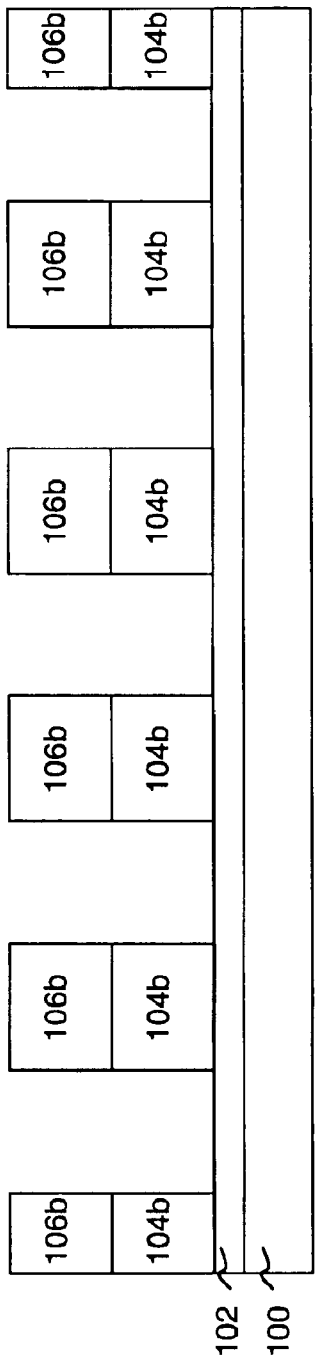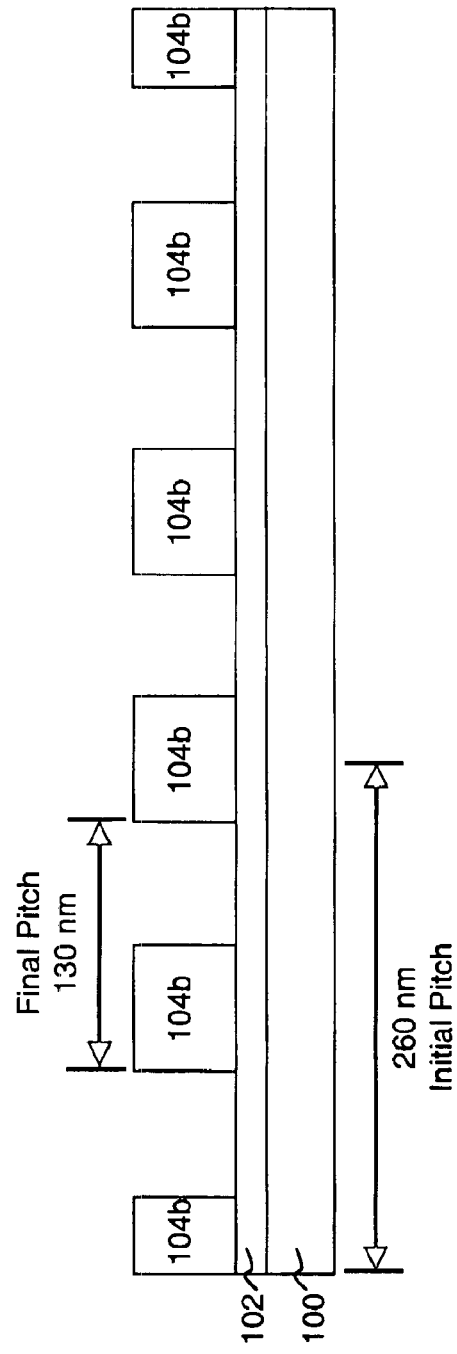

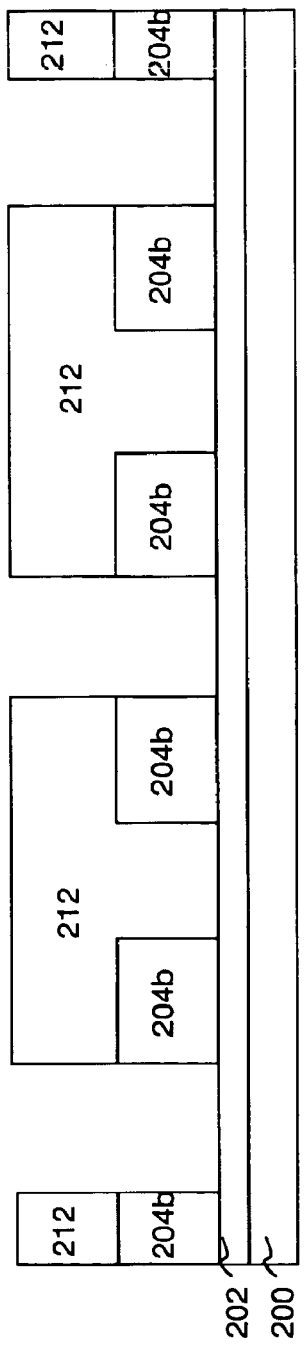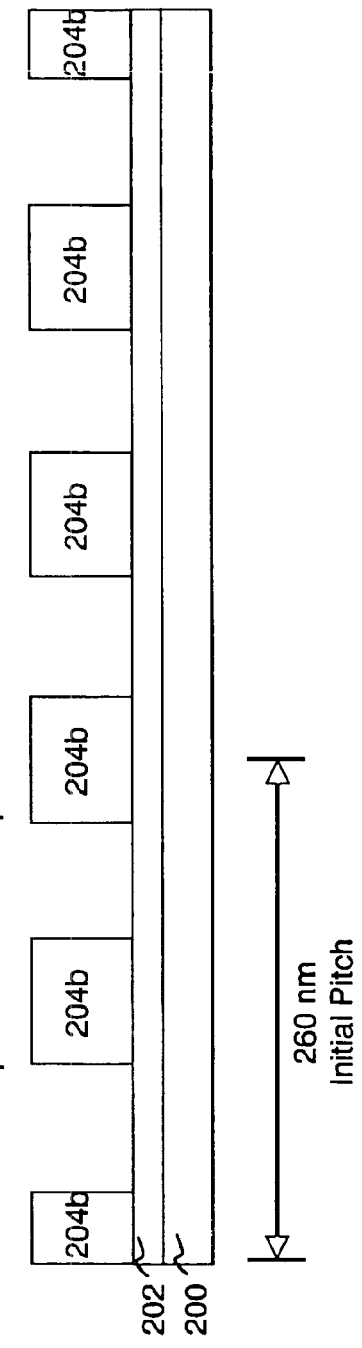

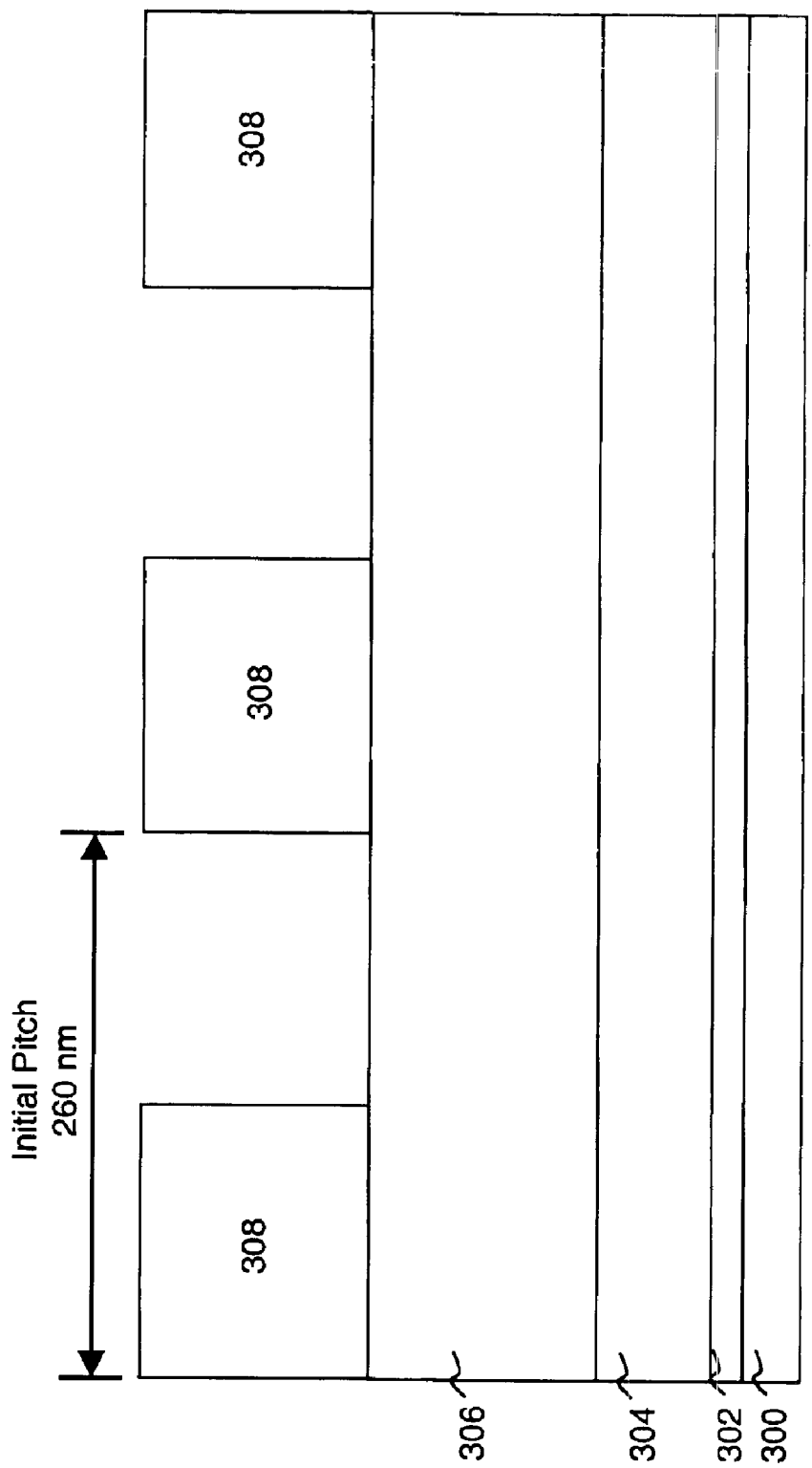

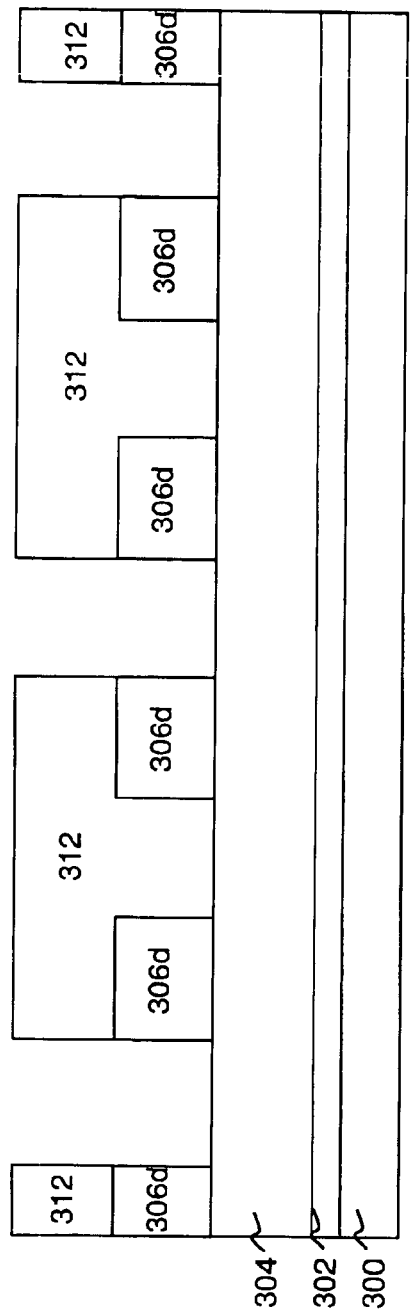
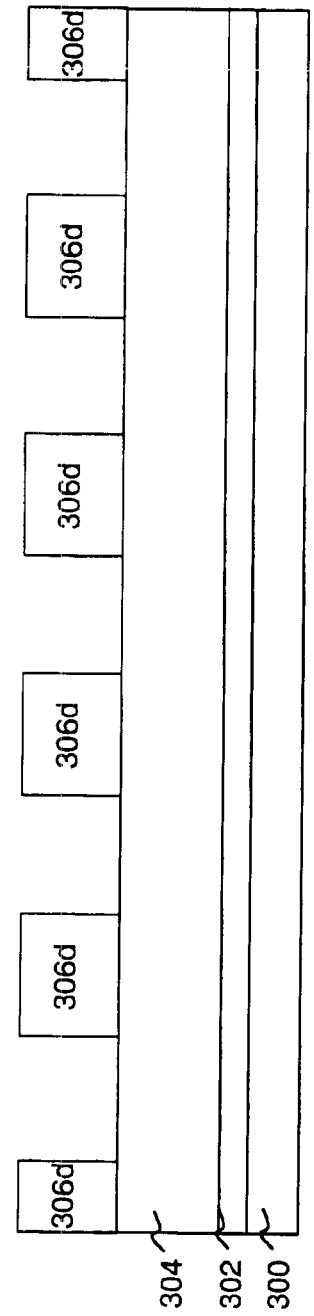
FIG. 3G
FIG. 3H

FABRICATION METHOD OF SUB-RESOLUTION PITCH FOR INTEGRATED CIRCUITS

DESCRIPTION OF THE INVENTION

1. Field of the Invention

This invention is in general related to a method of fabricating integrated-circuits and, more particularly, to a method of fabricating integrated circuits with a sub-resolution pitch.

2. Background of the Invention

Although modern integrated circuits already have very high device densities, for example, up to millions of devices per single chip, many applications still require even higher densities. Lithography is one, and probably the most important, manufacturing process that may be improved to obtain a high device density or a small feature size. However, the device density becomes more and more difficult to increase as the scale of devices approaches the limit of the lithography process.

With conventional photolithography methods using a 248 nm scanner, pitches smaller than 0.24 µm, the resolution of the scanner, are difficult to generate. A pitch is defined as a minimum center-to-center distance between two features, such as interconnect lines, pads, or pins. To realize a pitch of 90 nm or 65 nm, conventional methods would require a 193 nm or a 157 nm scanner, respectively. However, these scanners are not matured yet for industrial production.

Alternatively, to scale down device dimensions, resolution enhancement techniques (RET) such as phase shifting masks or off-axis illumination may be implemented. However, these conventional solutions are generally complicated and very expensive to implement in product manufacturing.

SUMMARY OF THE INVENTION

It is therefore an object of the present invention to provide a cost-effective approach to reducing a pitch of the lithography process.

In accordance with the present invention, there is provided a method of manufacturing a semiconductor device using a scanner, wherein the scanner is capable of realizing a minimum pitch, wherein the minimum pitch is the smallest possible pitch for the scanner, the method including providing a semiconductor substrate, forming a first layer over the semiconductor substrate, forming a second layer over the first layer, patterning the second layer to form a plurality of second layer patterns, patterning the first layer to form a plurality of first layer patterns, wherein a line width of the first layer patterns is greater than a line width of the second layer patterns, and each second layer pattern is located approximately over the center of a corresponding first layer pattern, performing a tone reversal to form a reversed tone for the second layer patterns, and etching the first layer patterns using the reversed tone as a mask, wherein the etched first layer patterns have a final pitch size, and wherein the final pitch is smaller than the minimum pitch.

Also in accordance with the present invention, there is provided a method of manufacturing a semiconductor device using a scanner, wherein the scanner is capable of realizing a minimum pitch, wherein the minimum pitch is the smallest possible pitch for the scanner, the method including providing a first layer, depositing a layer of photoresist over the first layer, patterning the photoresist to form a plurality of photoresist patterns, wherein the photoresist patterns have a line width approximately one fourth of the minimum pitch, and etching a portion of the first layer using the trimmed photoresist patterns as mask, wherein the etched first layer includes a flat layer with a plurality of protrusions thereon, and wherein the protrusions have a line width approximately one fourth of the minimum pitch, etching the flat layer to form a plurality of flat layer patterns, wherein a line width of the flat layer patterns is approximately three fourths of the minimum pitch, and wherein each protrusion is located approximately on top of the center of a corresponding flat layer pattern, performing a tone reversal to form a reversed tone for the protrusions, and etching the flat layer patterns, wherein the etched flat layer patterns have a final pitch size, and wherein the final pitch is approximately equal to a half of the minimum pitch.

Further in accordance with the present invention, there is provided a method of manufacturing a semiconductor device using a scanner, wherein the scanner is capable of realizing a minimum pitch, wherein the minimum pitch is the smallest possible pitch for the scanner, the method including providing a semiconductor substrate, forming a first layer over the semiconductor substrate, depositing a layer of photoresist over the first layer, patterning the photoresist to form a plurality of photoresist patterns using the scanner, wherein a line width of the photoresist patterns is approximately equal to a half of the minimum pitch, trimming the photoresist patterns, wherein the trimmed photoresist patterns have a line width approximately one fourth of the minimum pitch, etching a portion of the first layer using the trimmed photoresist patterns as mask, wherein the etched first layer includes a flat layer with a plurality of protrusions thereon, and wherein the protrusions have a line width approximately one fourth of the minimum pitch, etching the flat layer to form a plurality of flat layer patterns, wherein a line width of the flat layer patterns is approximately three fourths of the minimum pitch, and wherein each protrusion is located approximately on top of the center of a corresponding flat layer pattern, performing a tone reversal to form a reversed tone for the protrusions, and etching the flat layer patterns, wherein the etched flat layer patterns have a final pitch size, and wherein the final pitch is approximately equal to a half of the minimum pitch.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings,

FIGS. 1A–1K show a fabrication method consistent with a first embodiment of the present invention;

FIGS. 2A–2I shows a fabrication method consistent with a second embodiment of the present invention; and FIGS. 3A–3J show a fabrication method consistent with a third embodiment of the present invention.

DESCRIPTION OF THE EMBODIMENTS

Figure 1B:
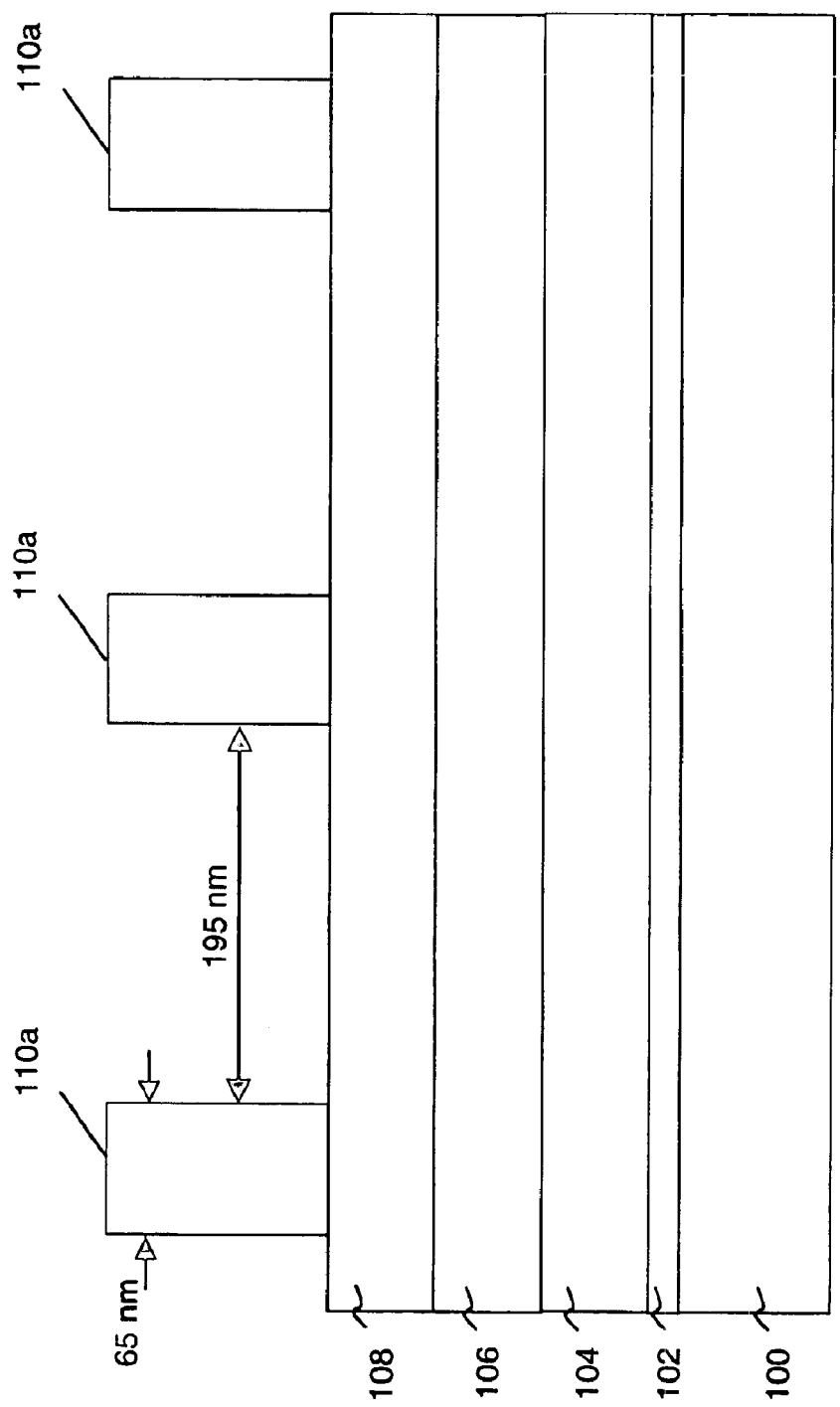

Reference will now be made in detail to embodiments of the invention, examples of which are illustrated in the accompanying drawings. Wherever possible, the same reference numbers will be used throughout the drawings to refer to the same or like parts.

For illustration purposes, in the following descriptions of embodiments of the present invention, a 248 nm scanner is used and a minimum, or smallest possible, initial pitch size of 260 nm is realized. However, it is to be understood that any suitable scanner may be used in connection with the methods of the present invention to obtain a reduced pitch.

In accordance with the present invention, there is provided a novel method of reducing a pitch of the lithography process, as described below with reference to FIGS. 1A–1K. FIGS. 1A–1K show a fabrication method consistent with a first embodiment of the present invention.

Referring to FIG. 1A, there is provided a semiconductor substrate 100, which may comprise any conventional semiconductor material, such as silicon or germanium. A gate dielectric layer 102 is formed over substrate 100. A gate contact layer 104 is formed over gate dielectric 102. Gate dielectric 102 may comprise oxide or other suitable gate dielectric materials. Gate contact 104 may comprise a layer of polysilicon, metal, or a combination therefor. A first dielectric layer 106 is deposited over gate contact 104, followed by depositing a second dielectric layer 108 over first dielectric layer 106. In one aspect, first dielectric layer 106 comprises silicon nitride. In another aspect, second dielectric layer 108 comprises polysilicon, and serves as a sacrificial layer. Gate dielectric 102 may be deposited using thermal growth or chemical vapor deposition (CVD) Gate contact 104, first dielectric layer 106, and second dielectric layer 108 may be deposited using chemical vapor deposition (CVD) or sputtering.

A photoresist layer (not numbered) is deposited over second dielectric layer 108 and patterned to form a plurality of first photoresist patterns 110. In the following description of the embodiment, without limiting the scope of the present invention, patterns 110 have the same line width and are equally spaced-apart, and the line width of each pattern 110 is equal to the space between two consecutive patterns 110. Therefore, the initial pitch is equal to the sum of the line width of photoresist patterns 110 and the space therebetween. With the assumption that an initial pitch size of 260 nm is realized using a 248 nm scanner, both the line width of patterns 110 and the space therebetween are 130 nm, as shown in FIG. 1A.

Referring to FIG. 1B, a step of photoresist trimming is performed to trim, or reduce, first photoresist patterns 110 to form second photoresist patterns 110a. Photoresist trimming is well-known to one skilled in the art and therefore is not described in detail herein. In one aspect, the line width of first photoresist patterns 110 is reduced by half by the photoresist trimming, i.e., the line width of second photoresist patterns 110a as shown in FIG. 1B is approximately 65 nm, about a fourth of the initial pitch of 260 nm, while the space therebetween is about 195 nm.

Figure 1C:
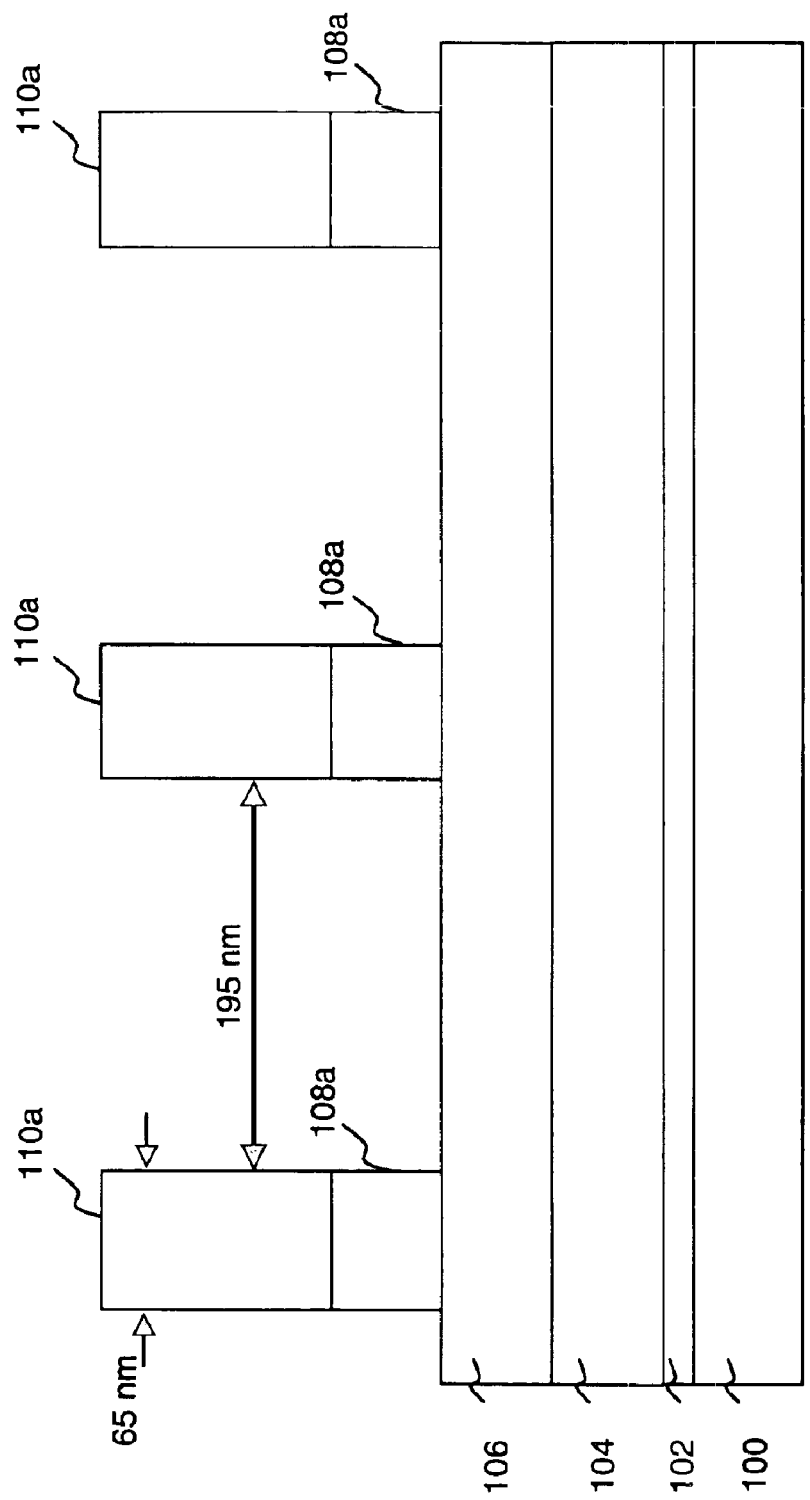

Second dielectric 108 is etched using second photoresist patterns 110a as an etch mask, forming a plurality of second dielectric patterns 108a. After etching second dielectric 108, first dielectric 106 is partially exposed, as shown in FIG. 1C. Second dielectric patterns 108a also have a line width of approximately 65 nm.

In one aspect, second photoresist patterns 110a are stripped off after the etching of second dielectric 108. In another aspect, second photoresist patterns 110a are not stripped off after the etching of second dielectric 108. It is to be understood that the removal of second photoresist patterns 110a is not critical to, the present invention. For illustration purposes, it is assumed that second photoresist patterns 110a are not stripped off after the etching of second dielectric 108.

Figure 1D:
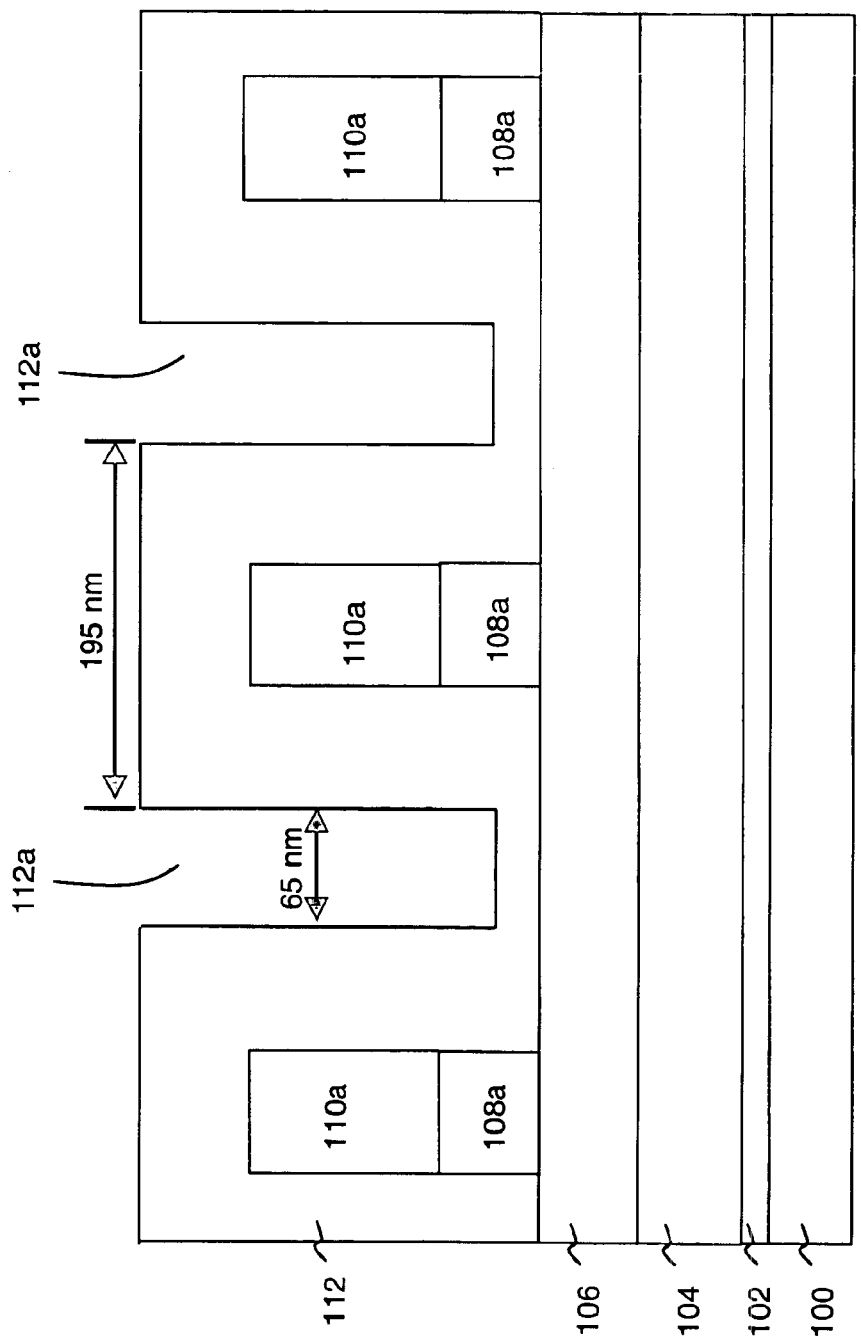

After etching second dielectric 108, a layer of polymer 112 is deposited over the tops of second photoresist patterns 110a, on the sidewalls of second photoresist patterns 110a and second dielectric patterns 108a, and over the exposed surface of first dielectric 106, as shown in FIG. 1D. Polymer 112 has a structure with a plurality of openings 112a. In one aspect, the thickness of polymer 112 is approximately 65 nm over the tops of second photoresist patterns 110a, on the sidewalls of second photoresist patterns 110a and second dielectric patterns 108a, and over the exposed surface of first dielectric 106. Therefore, the width of openings 112a is also approximately 65 nm. Polymer 112 may be deposited by chemical vapor deposition (CVD) or any other conventional deposition methods.

Figure 1E:
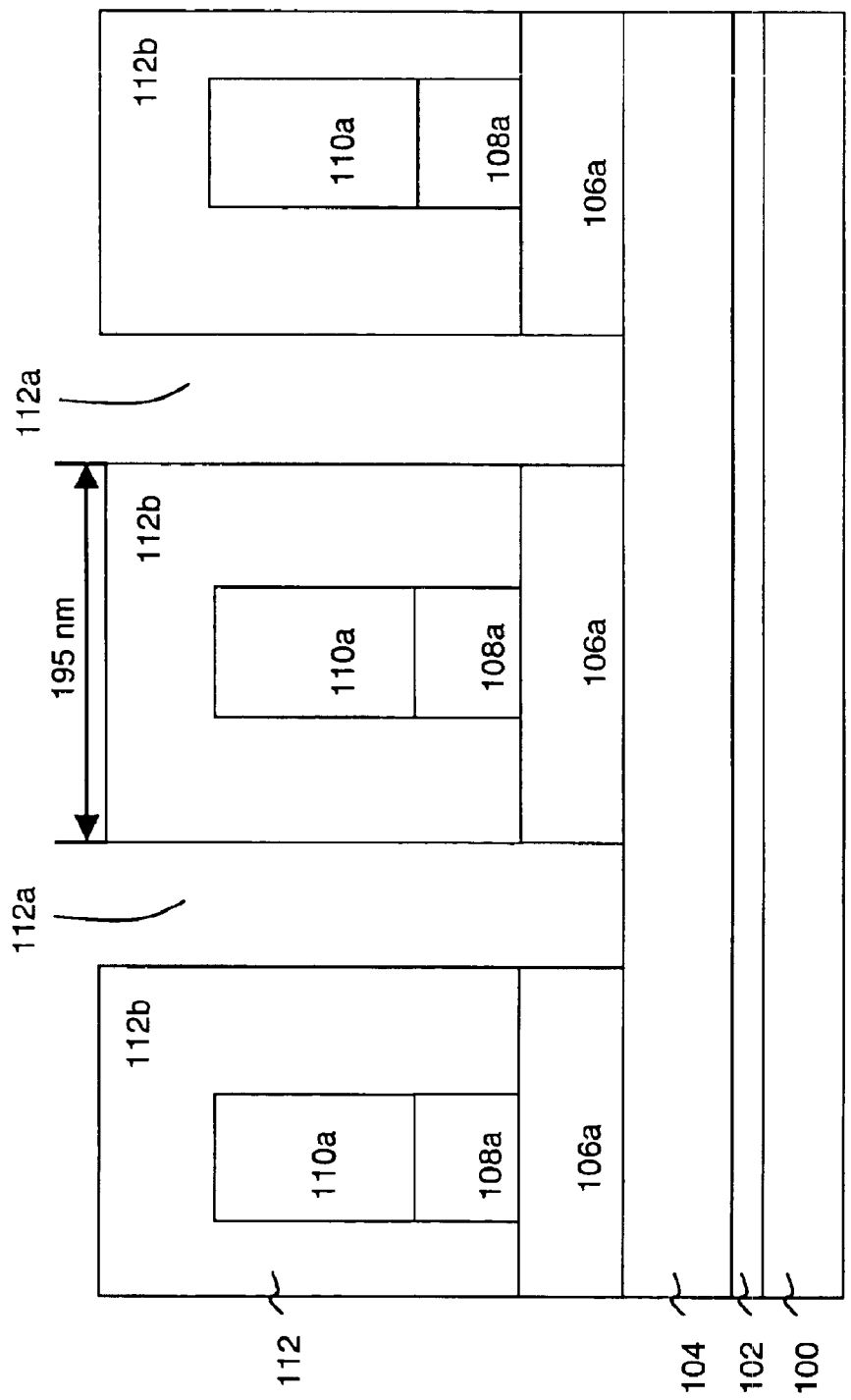
Figure 1F:
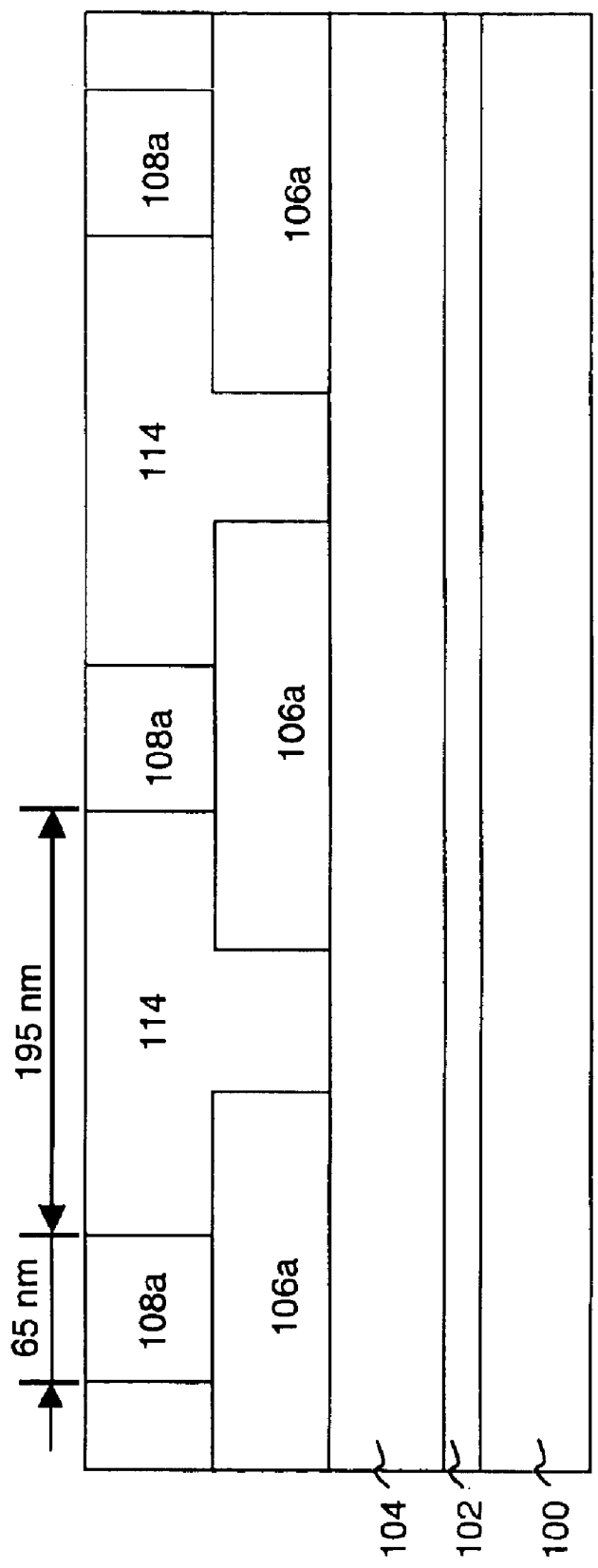

Polymer 112 is then etched to expose parts of first dielectric 106 at the bottom of openings 112a, followed by an etching step to etch through first dielectric 106. After the etching of polymer 112 and first dielectric 106, a plurality of first dielectric patterns 106a are formed, and parts of gate contact 104 are exposed. As shown in FIG. 1E, first dielectric patterns 106a have a line width of approximately 195 nm, three fourths of the initial pitch and greater than that of second dielectric patterns 108a. Also, second dielectric patterns 108a are located approximately over the center of first dielectric patterns 106a. Remaining polymer 112 and second photoresist patterns 110a are then removed, exposing first dielectric patterns 106a and second dielectric patterns 108a.

From the above description, one skilled in the art would appreciate the advantages of using polymer 112, which include a wider process window in providing an anisotropic coating than conventional plasma enhanced CVD (PECVD) oxide or nitride. Polymer may be processed at low temperatures, which is compatible with photoresist, and therefore can be removed together with the photoresist, resulting in a reduction in the number of manufacturing steps.

A third dielectric layer (not numbered) is deposited over the resultant structure including second dielectric patterns 108a, first dielectric patterns 106a, and gate contact layer 104. In one aspect, the third dielectric layer comprises oxide, deposited by high density plasma (HDP) method. In another aspect, the third dielectric layer comprises polymer. The third dielectric layer is then polished or etched, using a conventional chemical-mechanical-polishing (CMP) or etching method, to expose the surface of second dielectric layer 108a. After the polishing or etching a step, a plurality of third dielectric patterns 114 are formed, as FIG. 1F.

Figure 1G:
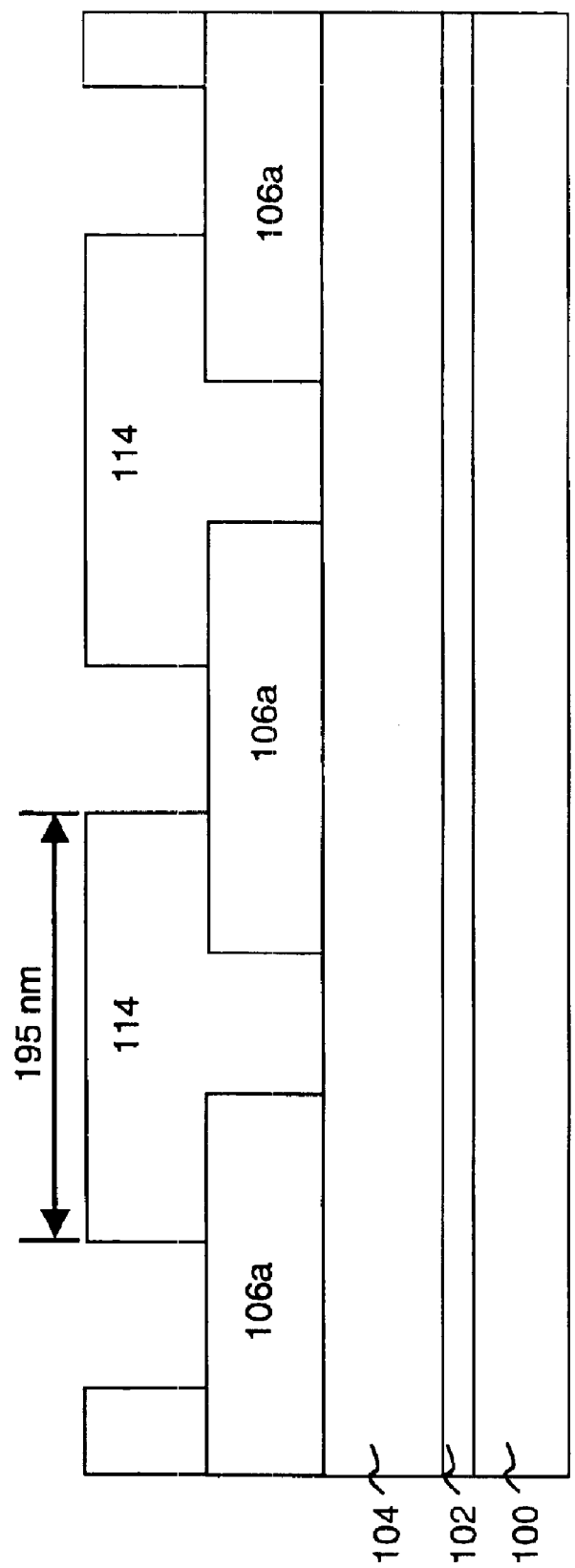

Referring to FIG. 1G, selective etching is performed to remove second dielectric patterns 108a, exposing parts of the surface of first dielectric patterns 106a. As shown in FIG. 1G, the width of the upper portion of third dielectric patterns 114 is approximately 195 nm. The steps of depositing the third dielectric and etching second dielectric patterns 108a are similar in function to a tone reversal of second dielectric patterns 108a. The term "tone reversal" used herein conveys the same meaning as "mask tone reversal" except the term is used to describe a non-photoresist or non-mask structure. Since the term "mask tone reversal" is well known to one skilled in the art, no additional description is required. As shown in FIG. 1G, third dielectric patterns 114 represent the reversed tone of second dielectric patterns 108a.

Referring to FIG. 1H, using third dielectric patterns 114, or the reversed tone of second dielectric patterns 108a, as a hard mask, another step of etching is performed to etch first dielectric patterns 106a to expose gate contact 104 that results in a plurality of first dielectric patterns 106b.

Third dielectric patterns 114 are removed afterwards, resulting in the structure shown in FIG. 1I. Conventional steps then follow to form patterned gate contacts 104a and to remove first dielectric patters 106b, as shown in FIGS. 1J and 1K, respectively, resulting in a final pitch of about 130 nm, approximately half of the initial pitch size.

Figure 2A:
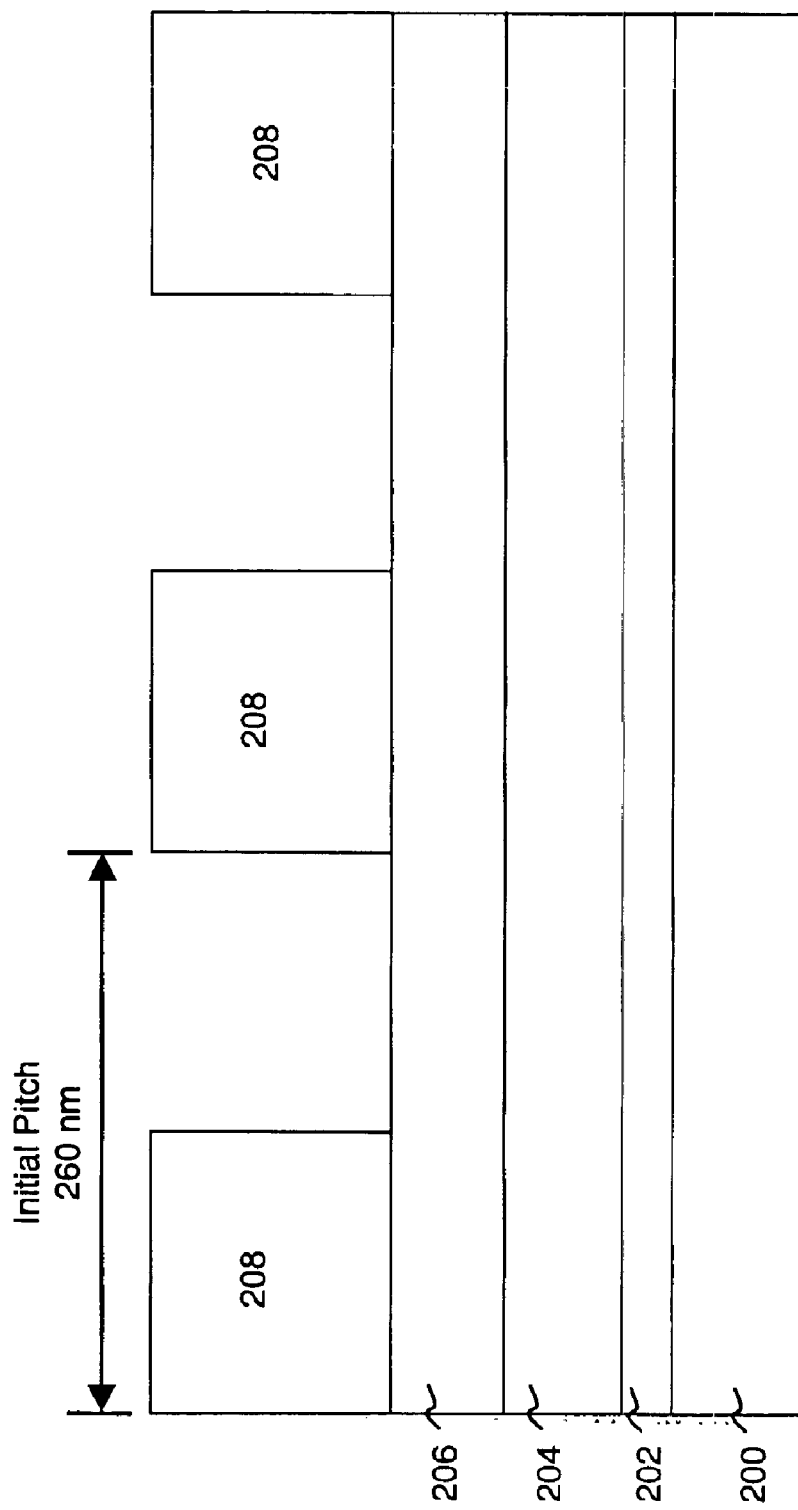

A second embodiment of the present invention is described with reference to FIGS. 2A–2I. As shown in FIG. 2A, there is provided a substrate 200 which may comprise any conventional semiconductor material such as silicon or germanium. A layer of gate dielectric 202 is formed over substrate 200. A layer of gate contact 204 is formed over gate dielectric 202. A first dielectric layer 206 is formed over gate contact 204. Gate dielectric 202 may comprise oxide. Gate contact 204 may comprise polysilicon, metal, or a combination thereof. First dielectric 206 may comprise silicon nitride (SiN).

After the formation of gate dielectric 202, gate contact 204, and first dielectric 206, a photoresist film is formed over first dielectric 206 and patterned to form a plurality of first photoresist patterns 208. An initial pitch as indicated in FIG. 2A is approximately 260 nm, assuming a 248 nm scanner is used. Therefore, the line width of first photoresist patterns 208 and the space therebetween are both approximately 130 nm.

Figure 2B:
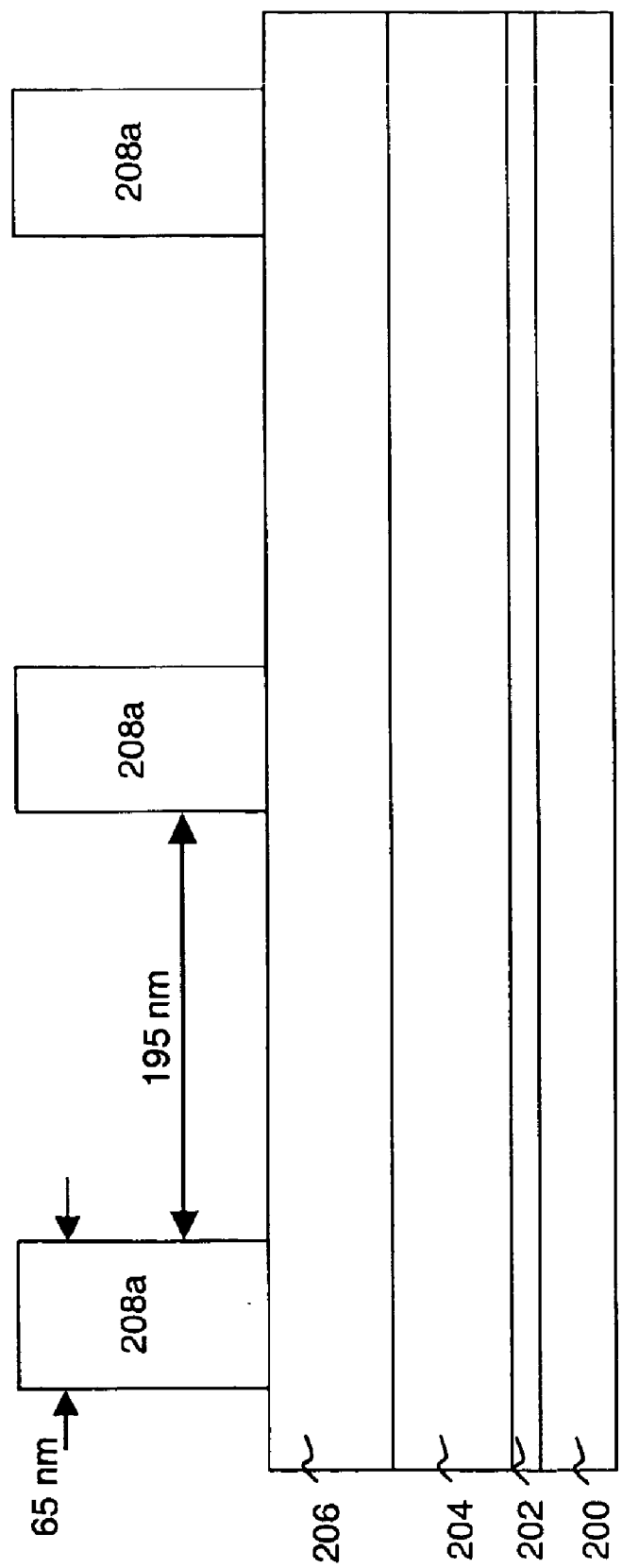

Photoresist trimming is then performed to trim first photoresist patterns 208 to form a plurality of second photoresist patterns 208a, as shown in FIG. 2B. After photoresist trimming, the line width of the photoresist patterns is reduced by half, i.e., the line width of second photoresist patterns 208a is approximately 65 nm, while the space therebetween is about 195 nm.

Figure 2C:
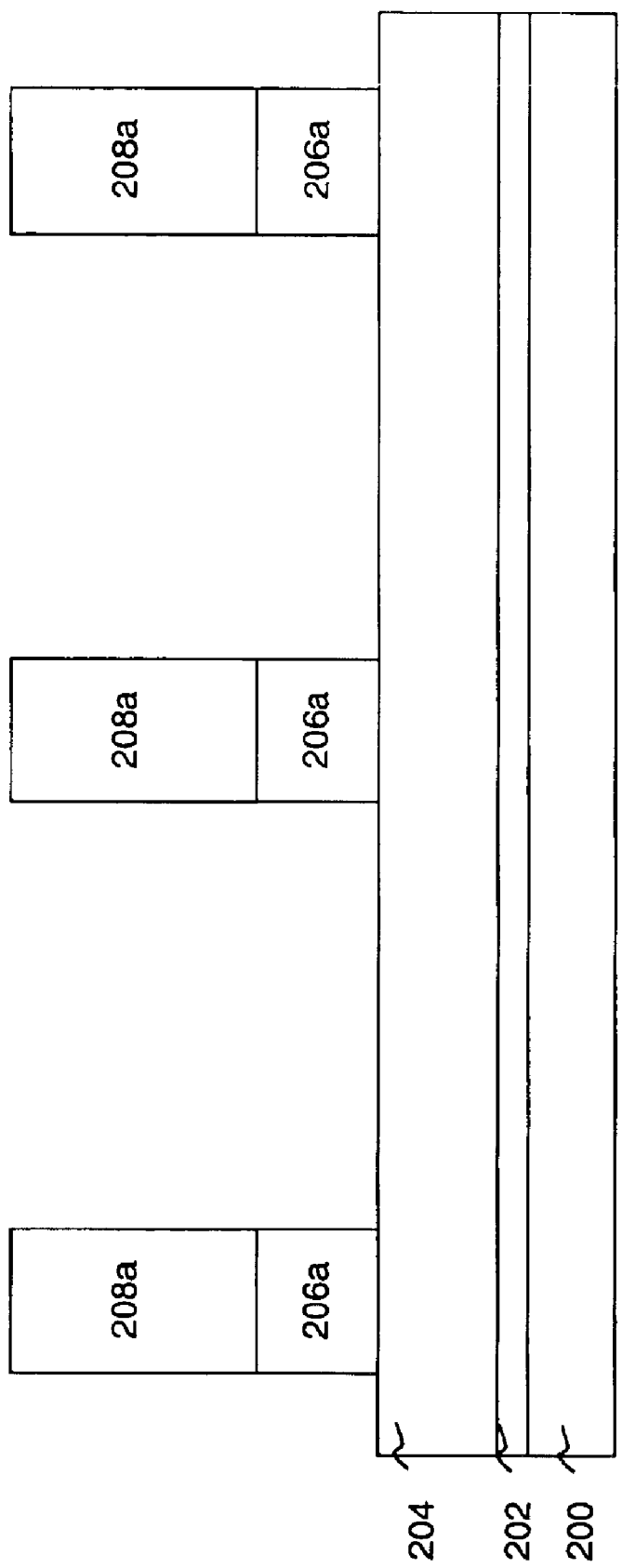

As shown in FIG. 2C, using second photoresist patterns 208a as mask, first dielectric 206 is etched to form a plurality of first dielectric patterns 206a, exposing parts of gate contact 204. First dielectric patterns 206a also have a line width of about 65 nm.

Figure 2D:
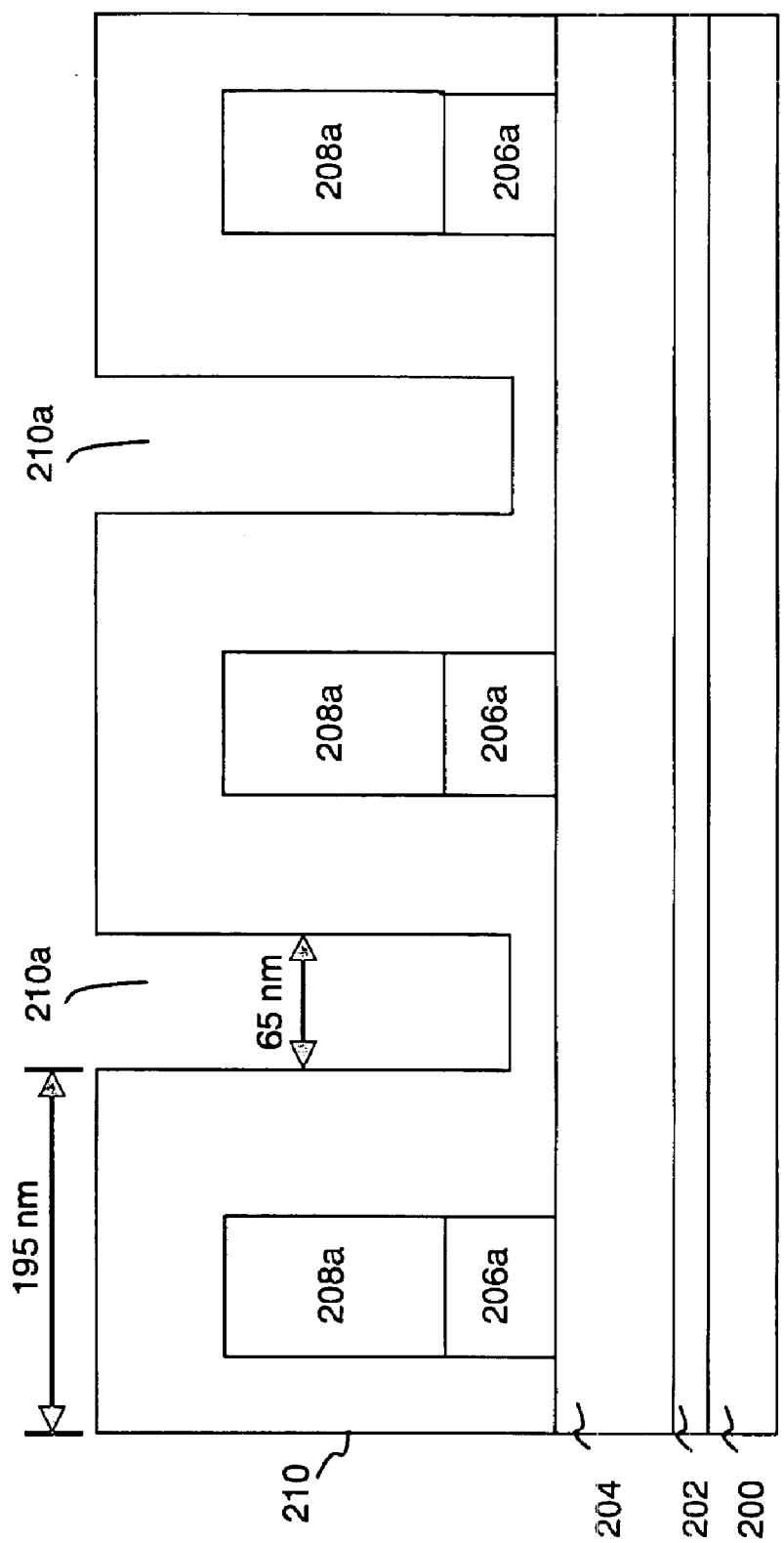

After the etching of first dielectric 206, a layer of polymer 210 is deposited over the tops of second photoresist patterns 208a, on the sidewalls of second photoresist patterns 208a and first patterns 206a, and over the exposed surfaces of gate contact 204, as shown in FIG. 2D. Polymer 210 has a structure with a plurality of openings 210a. In one aspect, the thickness of polymer 210 is approximately 65 nm over the tops of second photoresist patterns 208a, on the sidewalls of second photoresist patterns 208a and first dielectric patterns 206a, and over the exposed surfaces of gate contact 204. Therefore, the width of openings 210a is also approximately 65 nm. Polymer 210 may be deposited by chemical vapor deposition or any other conventional deposition methods.

Figure 2E:
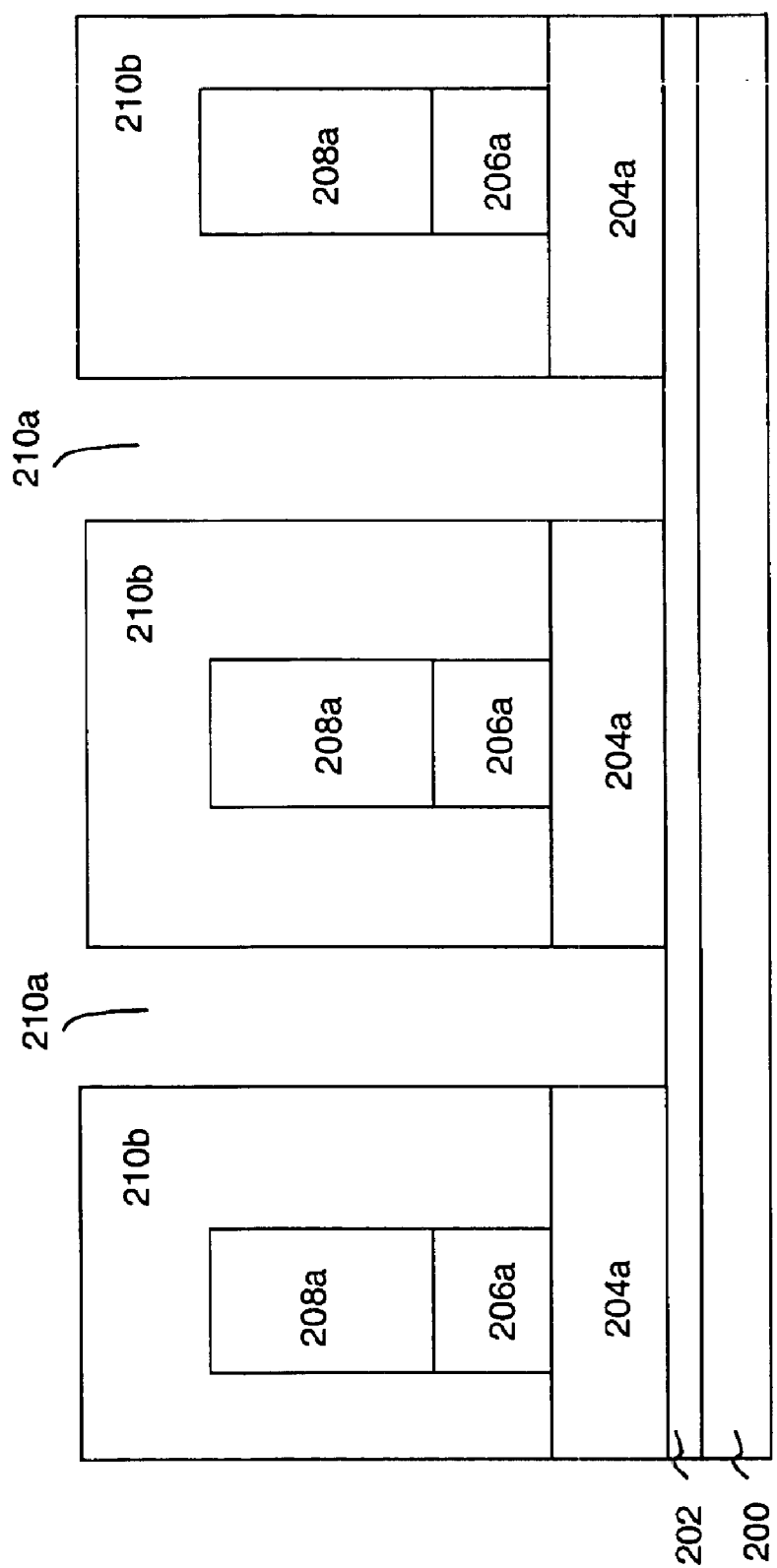

Polymer 210 is then etched to expose parts of gate contact 204 at the bottom of openings 210a, followed by a step of etching to etch through gate contact 204. After the etching of polymer 210 and gate contact 204, a plurality of gate contact patterns 204a are formed. As shown in FIG. 2E, gate contact patterns 204a have a line width of approximately 195 nm, which is about three fourths of the initial pitch and greater than that of first dielectric patterns 206a. Also, first dielectric patterns 206a are located approximately over the center of gate contact patterns 204a. Remaining polymer 210 and second photoresist patterns 208a are then removed, exposing gate contact patterns 204a and first dielectric patterns 206a.

Figure 2F:
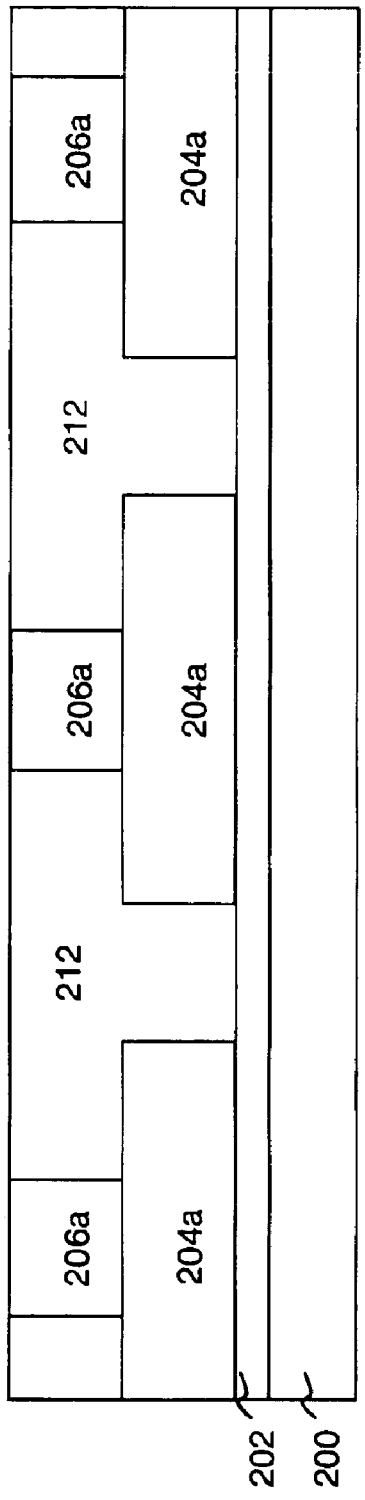
Figure 2G:
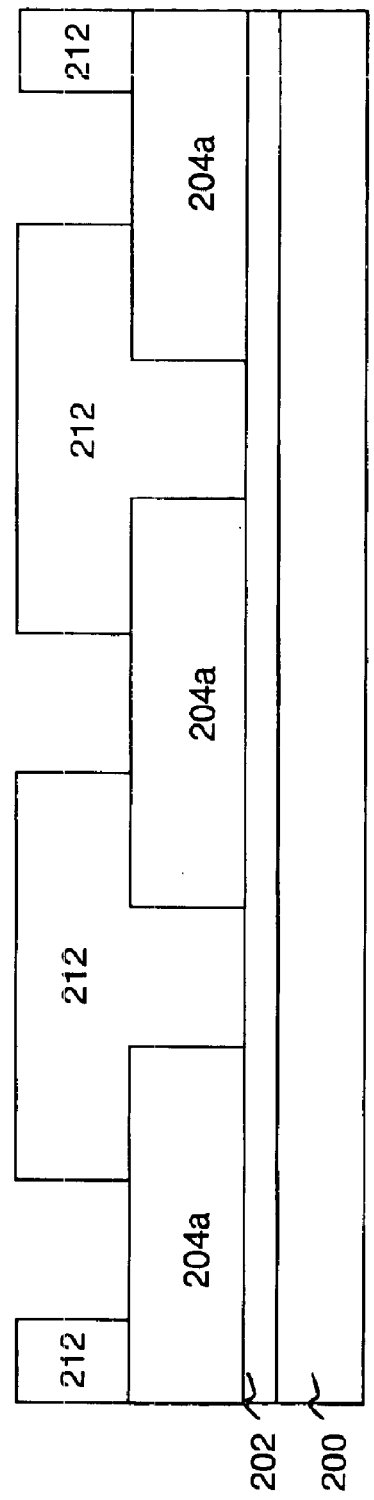

After polymer 210 and second photoresist patterns 208a are removed, a tone reversal is performed for first dielectric patterns 206a. First, a second dielectric layer (not numbered) is deposited over the resultant structure including first dielectric patterns 206a, gate contact patters 204a, and gate dielectric 202. In one aspect, the second dielectric layer comprises oxide deposited by high density plasma (HDP) method. In another aspect, the second dielectric layer comprises polymer. Then the second dielectric layer is polished or etched, using a conventional chemical-mechanical-polishing (CMP) or etching method, to expose the surface of first dielectric patterns 206a. After the polishing or etching step, a plurality of second dielectric patterns 212 are formed, as shown in FIG. 2F. Referring to FIG. 2G, selective etching is performed to remove first dielectric patterns 206a, exposing parts of the surface of gate contact patterns 204a. The step of selective etching does not etch away second dielectric patterns 212. As a result, second dielectric patterns 212 are the reversed tone of first dielectric patterns 206a.

Also as shown in FIG. 2G, the width of the upper portion of second dielectric patterns 212 is approximately 195 nm. Then, using second dielectric structures 212, or the reversed tone of first dielectric patterns 206a, as hard mask, another step of etching is performed to etch through gate contact patterns 204a, exposing gate dielectric 202 and resulting in a plurality of gate contact patterns 204b, as shown in FIG. 2H.

Second dielectric structures 212 are removed afterwards, resulting in the structure shown in FIG. 2I, wherein a pitch defined as the sum of the line width of gate contact patterns 204b and the space therebetween Is approximately 130 nm. Comparing FIG. 2I with FIG. 2A, a smaller pitch has been realized through the above processing steps.

Figure 3B:
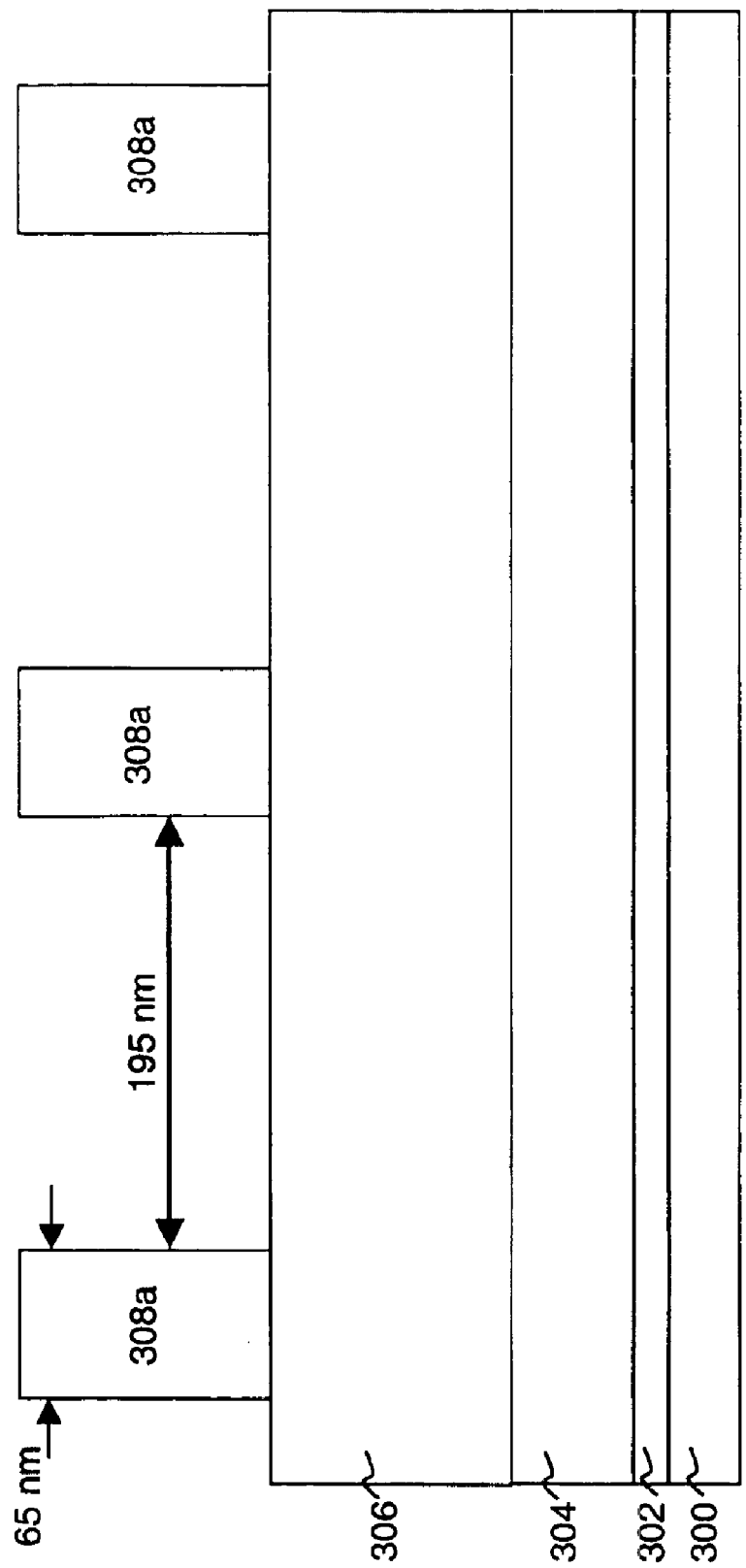

Next, a third embodiment of the present invention is described with reference to FIGS. 3A–3J. Referring to FIG. 3A, there is provided a substrate 300 which may comprise any conventional semiconductor material such as silicon or germanium. A layer of gate dielectric 302 is formed over substrate 300. A layer of gate contact 304 is formed over gate dielectric 302. A first dielectric layer 306 is formed over gate contact 304. Gate dielectric 302 may comprise oxide. Gate contact 304 may comprise polysilicon, metal, or a combination thereof. First dielectric 306 may comprise silicon nitride (SiN).

A photoresist film is formed over first dielectric 306 and patterned to form a plurality of first photoresist patterns 308. An initial pitch as indicated in FIG. 3A is approximately 260 nm. The line width of first photoresist patterns 308 and the space therebetween are both approximately 130 nm.

Photoresist trimming is performed to trim first photoresist structures 308 to form a plurality of second photoresist patterns 308a, as shown in FIG. 3B. The line width of patterns 308a is approximately 65 nm, and the space therebetween is about 195 nm.

Figure 3C:
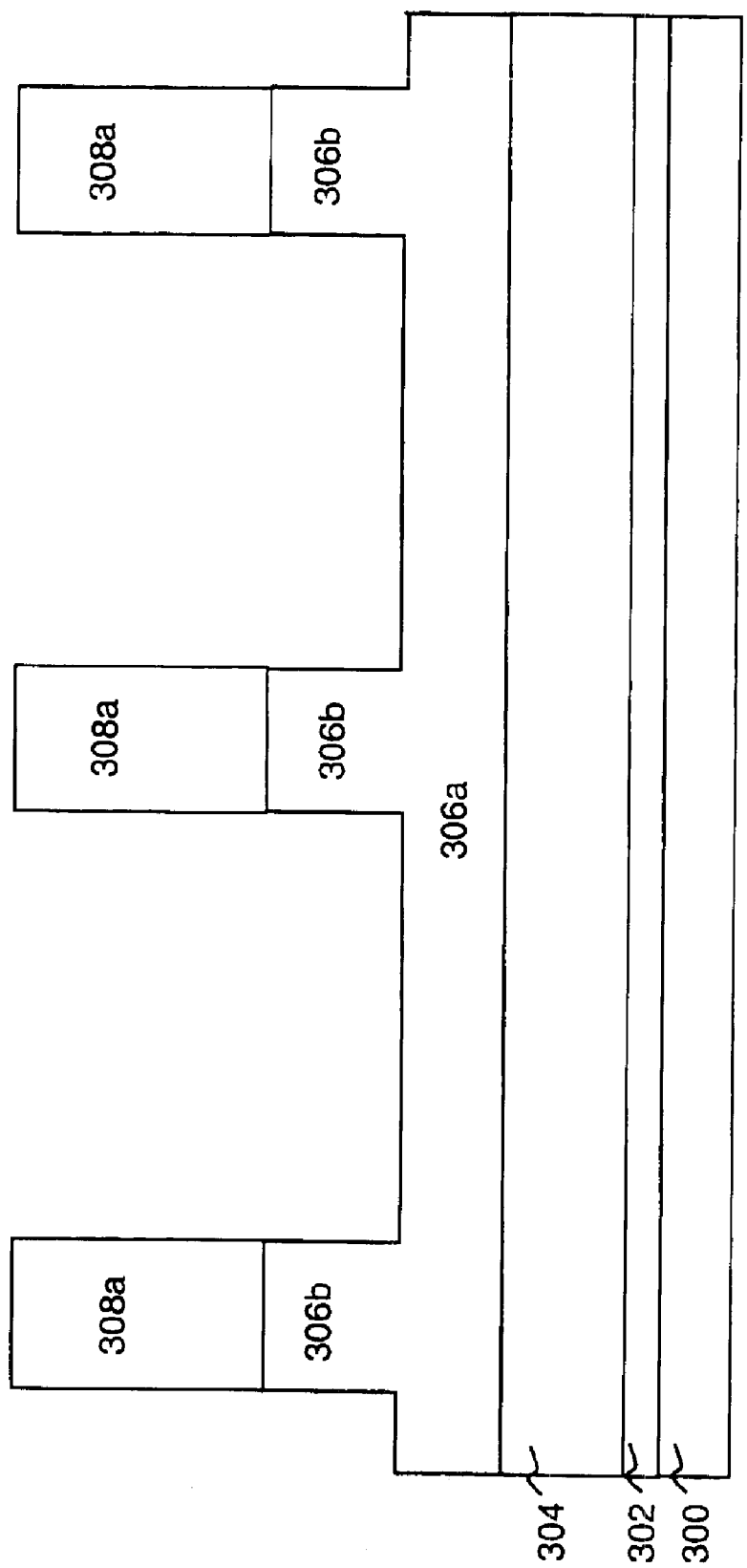

Using second photoresist patterns 308a as mask, first dielectric 306 is partially etched. As shown in FIG. 3C, the remaining part of first dielectric layer 306 has a structure including a flat layer 306a and a plurality of protrusions 306b. Protrusions 306b also have a line width of about 65 nm.

Figure 3D:
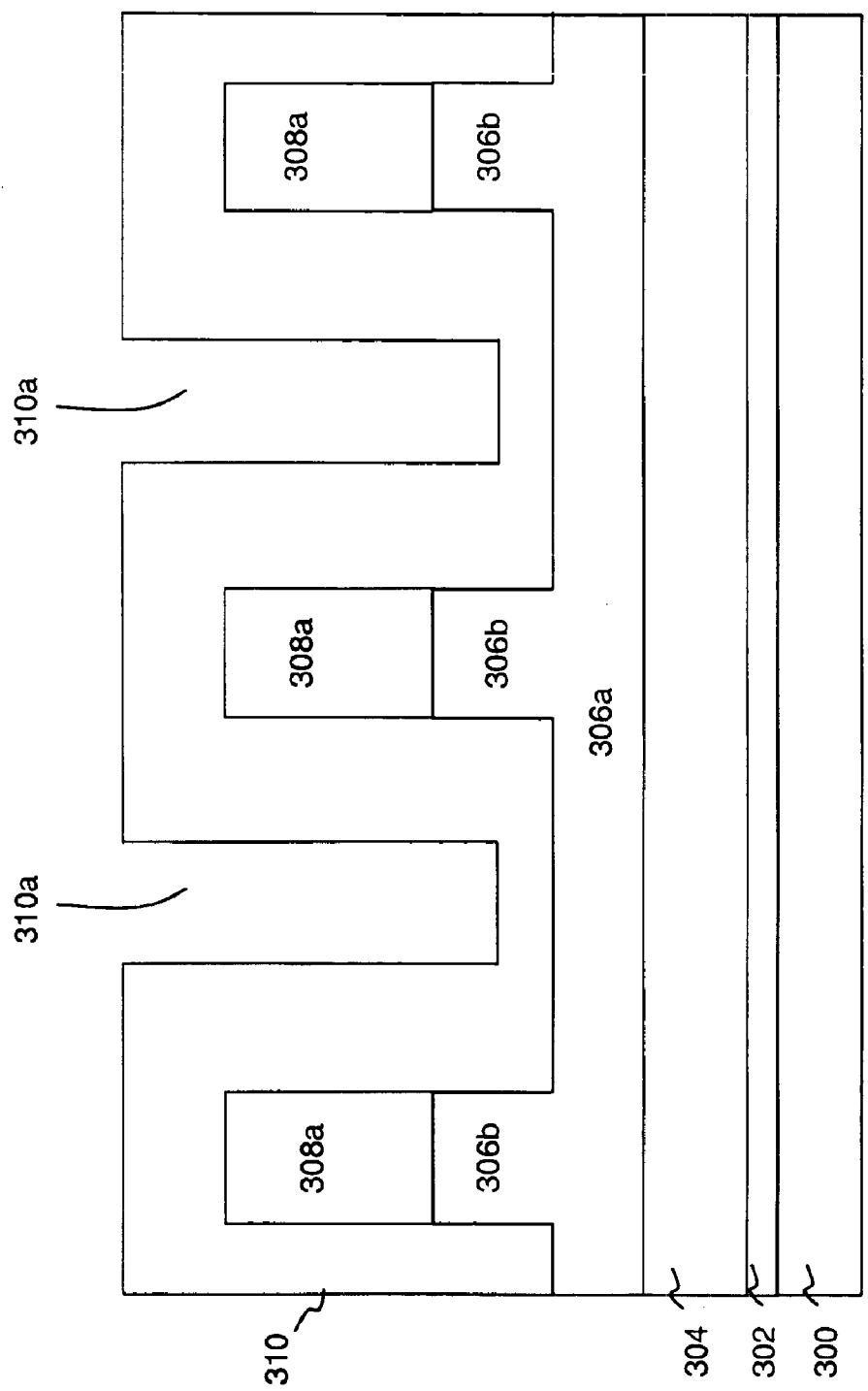

A layer of polymer 310 is then deposited over the tops of second photoresist patterns 308a, on the sidewalls of second photoresist patterns 308a and protrusions 306b, and over flat layer 306a, as shown in FIG. 3D. Polymer 310 has a structure with a plurality of openings 310a. In one aspect, the film thickness of polymer 310 is approximately 65 nm. Therefore, the width of openings 310a is also approximately 65 nm. Polymer 310 may be deposited by chemical vapor deposition or any other conventional deposition methods.

Figure 3E:
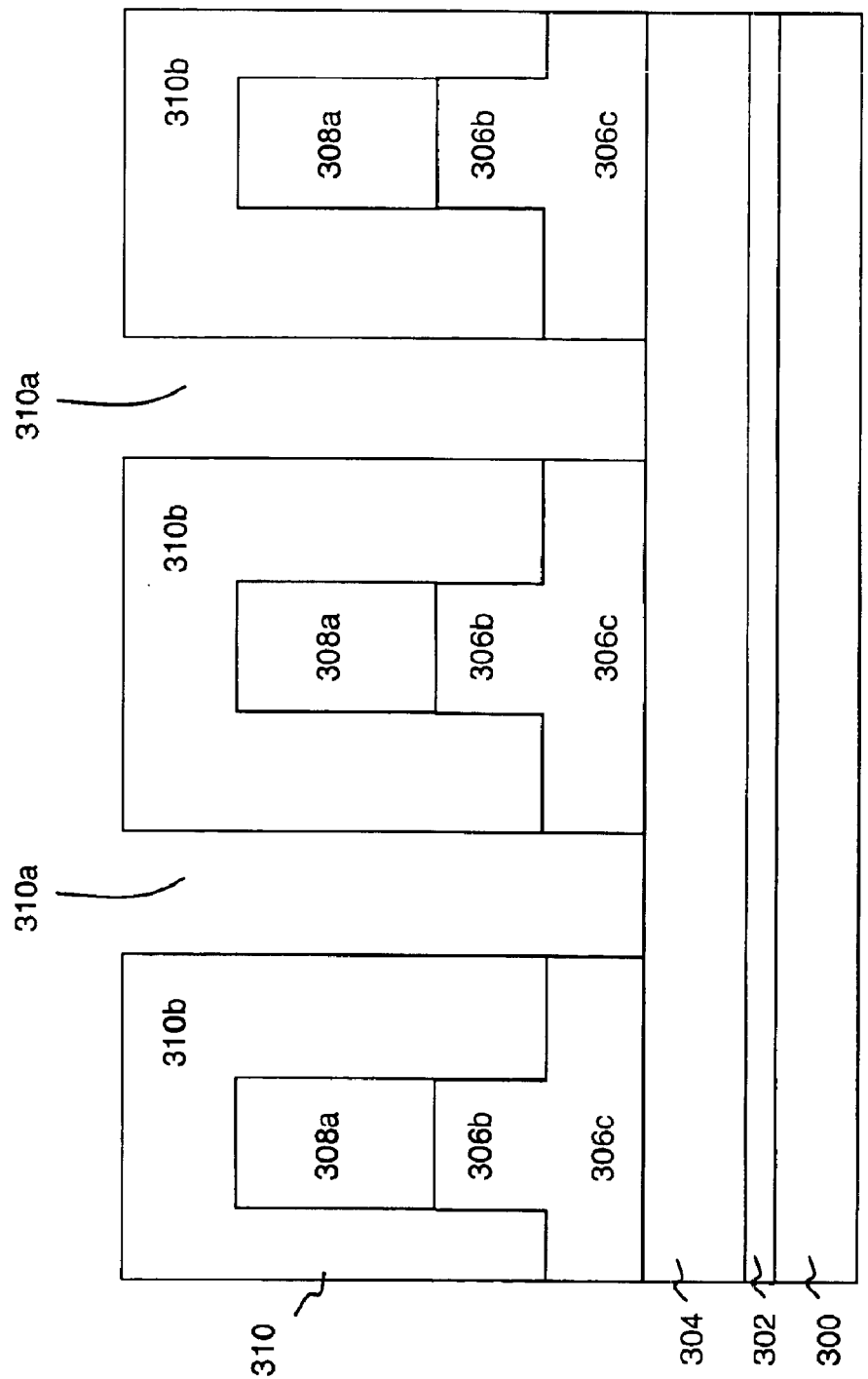

Polymer 310 is etched to expose parts of flat layer 306a at the bottom of openings 310a, followed by a step of etching to etch through flat layer 306a. After the etching of polymer 310 and flat layer 306a, a plurality of flat layer patterns 306c are formed, as shown in FIG. 3E. Remaining polymer 310 and second photoresist patterns 308a are then removed, exposing protrusions 306b and flat layer patterns 306c.

Figure 3F:
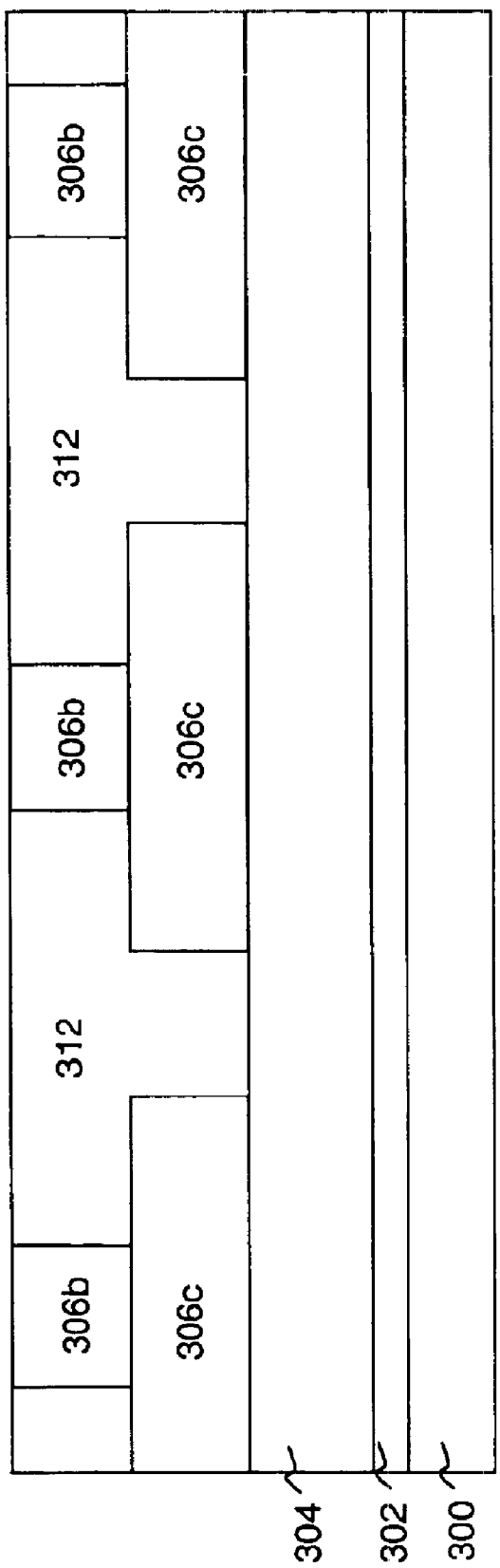

After polymer 310 and second photoresist patterns 308a are removed, a tone reversal is performed for protrusions 306b. First, a second dielectric layer (not numbered) is deposited over the resultant structure including protrusions 306b, flat layer patterns 306c, and gate contact 304. In one aspect, the second dielectric layer may comprise oxide deposited by high density plasma (HDP) method. In another aspect, the second dielectric layer may comprise polymer. The second dielectric layer is then polished or etched, using a conventional chemical-mechanical-polishing (CMP) or etching method, to expose the surface of protrusions 306b. After the polishing or etching step, a plurality of second dielectric patterns 312 are formed, as shown in FIG. 3F.

Referring to FIG. 3G, selective etching is performed to remove protrusions 306b and to etch through flat layer patterns 306c, exposing parts of gate contact 304. After the etching of protrusions 306b and flat layer patterns 306c, first dielectric patterns 306d as shown in FIG. 3G are formed. The step of selective etching does not etch away second dielectric structures 312. As shown in FIG. 3G, the width of the upper portion of second dielectric structure 312 is approximately 195 nm.

Figure 3I:
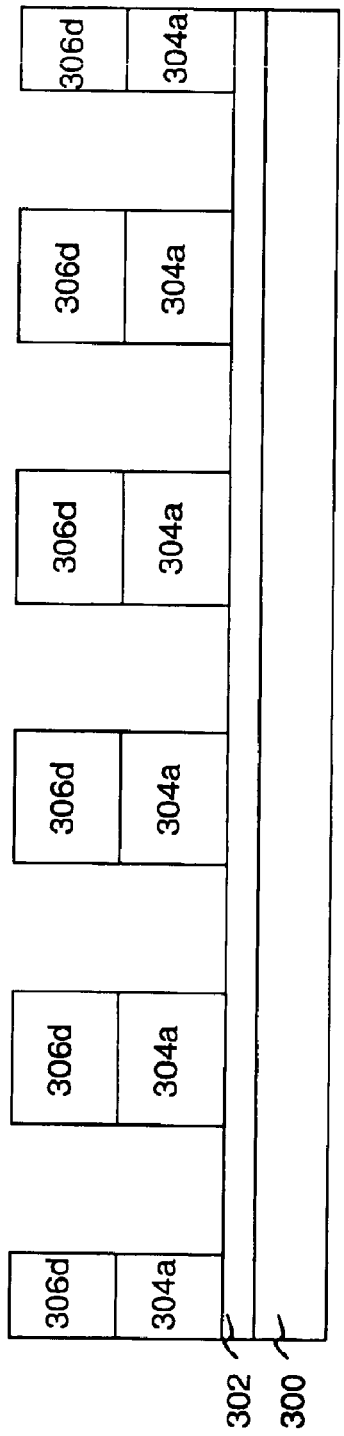

Second dielectric structures 312 are removed afterwards, resulting in the structure as shown in FIG. 3H, including first dielectric patterns 306d. Then, as shown in FIG. 3I, a step of etching is performed to etch gate contact 304 using first dielectric patterns 306d as a hard mask, forming a plurality of gate contact patterns 304a.

Figure 3J:
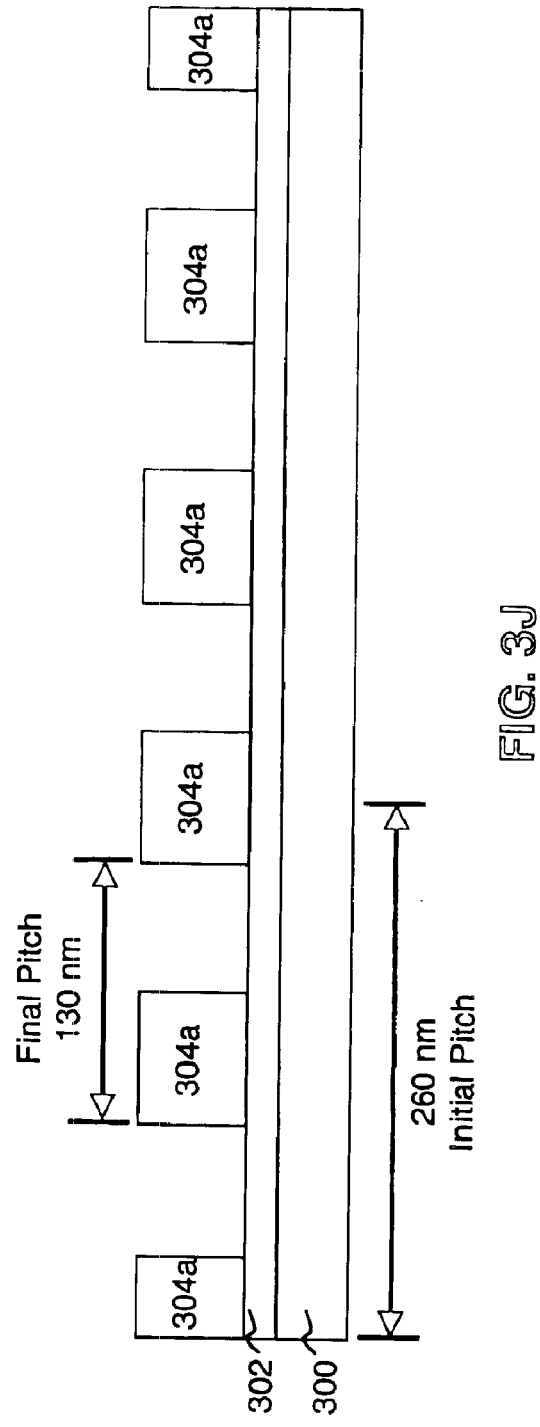

Finally, first dielectric patterns 306d are removed using any conventional method. As shown in FIG. 3J, contact patterns 304a have a final pitch of approximately 130 nm, about half of the initial pitch.

Although the gate dielectric and gate contact layers are formed over the substrate in the above descriptions of the embodiments, it is to be understood that the gate dielectric and gate contact layers are not required for the present invention. Methods of the present invention are not limited to the manufacturing of devices having a MOS structure. The methods consistent with embodiments of the present invention may also be applied to realize a smaller pitch on any other device that requires a lithography step in the manufacturing process thereof.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing a semiconductor device using a scanner, wherein the scanner is capable of realizing a minimum pitch, wherein the minimum pitch is the smallest possible pitch for the scanner, the method comprising:

providing a semiconductor substrate;

forming a first layer over the semiconductor substrate;

forming a second layer over the first layer;

patterning the second layer to form a plurality of second layer patterns;

patterning the first layer to form a plurality of first layer patterns, wherein a line width of the first layer patterns is greater than a line width of the second layer patterns, and each second layer pattern is located approximately over the center of a corresponding first layer pattern;

performing a tone reversal to form a reversed tone for the second layer patterns; and etching the first layer patterns using the reversed tone as a mask, wherein the etched first layer patterns have a final pitch size, and wherein the final pitch is smaller than the minimum pitch.

2. The method of claim 1, wherein patterning the second layer comprises depositing a layer of photoresist over the second layer;

patterning the photoresist to form a plurality of photoresist patterns using the scanner, wherein a line width of the photoresist patterns is approximately equal to half of the minimum pitch;

trimming the photoresist patterns, wherein the trimmed photoresist patterns have a line width substantially smaller than half of the minimum pitch; and etching the second layer using the trimmed photoresist patterns as mask.

3. The method of claim 2, wherein the photoresist is removed before patterning the first layer.

4. The method of claim 1, wherein patterning the first layer comprises:

depositing a third layer over the second layer patterns and the first layer, wherein the third layer has a structure with a plurality of openings;

etching parts of the third layer at the bottom of the plurality of openings;

etching the first layer using the etched third layer as mask; and removing the third layer.

5. The method of claim 4, wherein the third layer comprises polymer.

6. The method of claim 4, wherein patterning the second layer comprises depositing and patterning a layer of photoresist, and wherein the photoresist and the third layer are removed together.

7. The method of claim 1, wherein performing the tone reversal for the second layer patterns comprises forming a layer of oxide over the second layer patterns and the first layer patterns;

polishing the oxide to expose the second layer patterns and to form a plurality of oxide patterns; and etching the second layer patterns;

wherein the oxide patterns represent the reversed tone of the second layer patterns.

8. The method of claim 7, wherein the first layer patterns are etched using the oxide patterns as mask.

9. The method of claim 1, wherein the line width of the second layer patterns is approximately one fourth of the minimum pitch.

10. The method of claim 1, wherein the line width of the first layer patterns is approximately three fourths of the minimum pitch, and a space between the first layer patterns is approximately one fourth of the minimum pitch.

11. The method of claim 1, wherein the final pitch is approximately half of the minimum pitch.

12. The method of claim 1, wherein the first layer is a gate contact layer.

13. The method of claim 1, further comprising forming a gate dielectric layer over the substrate; and forming a gate contact layer over the gate dielectric;

wherein the first layer is formed over the gate contact layer.

14. The method of claim 13, further comprising etching the gate contact layer using the etched first layer patterns as a mask; and removing the first layer patterns.

15. A method of manufacturing a semiconductor device using a scanner, wherein the scanner is capable of realizing a minimum pitch, wherein the minimum pitch is the smallest possible pitch for the scanner, the method comprising:

providing a first layer;

depositing a layer of photoresist over the first layer;

patterning the photoresist to form a plurality of photoresist patterns, wherein the photoresist patterns have a line width approximately one fourth of the minimum pitch; and etching a portion of the first layer using the trimmed photoresist patterns as mask, wherein the etched first layer includes a flat layer with a plurality of protrusions thereon, and wherein the protrusions have a line width approximately one fourth of the minimum pitch;

etching the flat layer to form a plurality of flat layer patterns, wherein a line width of the flat layer patterns is approximately three fourths of the minimum pitch, and wherein each protrusion is located approximately on top of the center of a corresponding flat layer pattern;

performing a tone reversal to form a reversed tone for the protrusions; and etching the flat layer patterns, wherein the etched flat layer patterns have a final pitch size, and wherein the final pitch is approximately equal to a half of the minimum pitch.

16. The method of claim 15, further comprising providing a gate contact layer, wherein the first layer is provided over the gate contact layer; and etching the gate contact layer using the etched flat layer patterns as mask.

17. The method of claim 15, wherein performing the tone reversal for the protrusions comprises forming a layer of oxide over the protrusions and the flat layer;

polishing the oxide to expose the protrusions and to form a plurality of oxide patterns; and etching the protrusions;

wherein the oxide patterns represent the reversed tone of the protrusions.

18. A method of manufacturing a semiconductor device using a scanner, wherein the scanner is capable of realizing a minimum pitch, wherein the minimum pitch is the smallest possible pitch for the scanner, the method comprising:

providing a semiconductor substrate;

forming a first layer over the semiconductor substrate;

depositing a layer of photoresist over the first layer;

patterning the photoresist to form a plurality of photoresist patterns using the scanner, wherein a line width of the photoresist patterns is approximately equal to a half of the minimum pitch;

trimming the photoresist patterns, wherein the trimmed photoresist patterns have a line width approximately one fourth of the minimum pitch;

etching a portion of the first layer using the trimmed photoresist patterns as mask, wherein the etched first layer includes a flat layer with a plurality of protrusions thereon, and wherein the protrusions have a line width approximately one fourth of the minimum pitch;

etching the flat layer to form a plurality of flat layer patterns, wherein a line width of the flat layer patterns is approximately three fourths of the minimum pitch, and wherein each protrusion is located approximately on top of the center of a corresponding flat layer pattern;

performing a tone reversal to form a reversed tone for the protrusions; and etching the flat layer patterns, wherein the etched flat layer patterns have a final pitch size, and wherein the final pitch is approximately equal to a half of the minimum pitch.

19. The method of claim 18, further comprising forming a gate dielectric layer over the semiconductor substrate;

forming a gate contact layer over the gate dielectric layer, wherein the first layer is formed over the gate contact layer;

etching the gate contact layer using the etched flat layer patterns as a mask; and removing the first layer patterns.

20. The method of claim 18, wherein etching the flat layer comprises depositing a layer of polymer over the flat layer and the protrusions, wherein the polymer has a structure with a plurality of openings;

etching the part of the polymer at the bottom of the openings;

etching the flat layer using the etched polymer as a mask; and removing the polymer.

* * * * *